US008709154B2

(12) United States Patent
Stoddard

(10) Patent No.: US 8,709,154 B2
(45) Date of Patent: *Apr. 29, 2014

(54) METHODS FOR MANUFACTURING MONOCRYSTALLINE OR NEAR-MONOCRYSTALLINE CAST MATERIALS

(75) Inventor: Nathan G. Stoddard, Gettysburg, PA (US)

(73) Assignee: AMG IdealCast Solar Corporation, Wayne, PA (US)

( * ) Notice: Subject to any disclaimer, the term of this patent is extended or adjusted under 35 U.S.C. 154(b) by 1129 days.

This patent is subject to a terminal disclaimer.

(21) Appl. No.: 12/670,212

(22) PCT Filed: Jul. 23, 2008

(86) PCT No.: PCT/US2008/070805
§ 371 (c)(1),
(2), (4) Date: Jan. 22, 2010

(87) PCT Pub. No.: WO2009/015167
PCT Pub. Date: Jan. 29, 2009

(65) Prior Publication Data
US 2010/0192838 A1 Aug. 5, 2010

Related U.S. Application Data

(60) Provisional application No. 60/951,926, filed on Jul. 25, 2007.

(51) Int. Cl.
C30B 11/02 (2006.01)

(52) U.S. Cl.
USPC .................. 117/81; 117/82; 117/83

(58) Field of Classification Search
USPC ............................... 117/81, 82, 83
See application file for complete search history.

(56) References Cited

U.S. PATENT DOCUMENTS

| 3,581,804 | A | 6/1971 | Woltering |
| 3,653,432 | A | 4/1972 | Schmid et al. |
| 3,664,411 | A | 5/1972 | Carver et al. |
| 3,898,051 | A | 8/1975 | Schmid |

(Continued)

FOREIGN PATENT DOCUMENTS

| CN | 1473968 | 2/2004 |
| CN | 1485467 | 3/2004 |

(Continued)

OTHER PUBLICATIONS

Yajun Chen et al., "Growth Mechanism of Column Crystals in Directional Solidification," Journal of Tsinghua University (Science and Technology), vol. 44, No. 11, Nov. 4, 2004, pp. 1464-1467.

(Continued)

Primary Examiner — Bob M Kunemund
(74) Attorney, Agent, or Firm — Barnes & Thornburg LLP; Thomas J. McWilliams; Edward F. Behm, Jr.

(57) ABSTRACT

Methods are provided for casting one or more of a semiconductor, an oxide, and an intermetallic material. With such methods, a cast body of a monocrystalline form of the one or more of a semiconductor, an oxide, and an intermetallic material may be formed that is free of, or substantially free of, radially-distributed impurities and defects and having at least two dimensions that are each at least about 35 cm.

22 Claims, 12 Drawing Sheets

(56) References Cited

U.S. PATENT DOCUMENTS

| | | |
|---|---|---|
| 4,075,055 A | 2/1978 | Ciszek et al. |
| 4,094,621 A | 6/1978 | Hehl |
| 4,101,624 A | 7/1978 | Johnson et al. |
| 4,175,610 A | 11/1979 | Zauhar et al. |
| 4,382,838 A | 5/1983 | Authier |
| 4,834,166 A | 5/1989 | Nakano |
| 5,108,720 A | 4/1992 | Bourbina et al. |
| 5,205,872 A | 4/1993 | Mitsunori et al. |
| 5,211,802 A | 5/1993 | Kaneko et al. |
| 5,229,082 A | 7/1993 | Seidensticker et al. |
| 5,242,531 A | 9/1993 | Klingshirn et al. |
| 5,264,070 A | 11/1993 | Urquhart et al. |
| 5,324,488 A | 6/1994 | Klingshirn et al. |
| 5,340,410 A | 8/1994 | Endroes et al. |
| 5,363,796 A | 11/1994 | Kobayashi et al. |
| 5,363,799 A | 11/1994 | Yonehara et al. |
| 5,431,869 A | 7/1995 | Kumar et al. |
| 5,443,032 A | 8/1995 | Vichr et al. |
| 5,549,746 A | 8/1996 | Scott et al. |
| 5,614,019 A | 3/1997 | Vichr et al. |
| 5,707,744 A | 1/1998 | King et al. |
| 5,714,004 A | 2/1998 | Okuno |
| 5,753,038 A | 5/1998 | Vichr et al. |
| 5,759,879 A | 6/1998 | Iwasaki |
| 5,800,611 A | 9/1998 | Christensen |
| 5,827,773 A | 10/1998 | Voutsas |
| 5,944,890 A | 8/1999 | Kitou et al. |
| 5,959,314 A | 9/1999 | Voutsas |
| 6,027,563 A | 2/2000 | Choudhury et al. |
| 6,106,614 A | 8/2000 | Stephens et al. |
| 6,106,739 A | 8/2000 | Stephens et al. |
| 6,120,602 A | 9/2000 | Stephens et al. |
| 6,136,091 A | 10/2000 | Yamazaki et al. |
| 6,171,393 B1 | 1/2001 | Kurosaka et al. |
| 6,334,603 B1 | 1/2002 | Wakita et al. |
| 6,342,312 B2 | 1/2002 | Oba et al. |
| 6,635,555 B2 | 10/2003 | Voutsas |
| 6,664,147 B2 | 12/2003 | Voutsas |
| 6,686,978 B2 | 2/2004 | Voutsas |
| 6,732,992 B2 | 5/2004 | Wakita et al. |
| 6,769,473 B1 | 8/2004 | Adachi et al. |
| 6,805,745 B2 | 10/2004 | Snyder et al. |
| 6,818,484 B2 | 11/2004 | Voutsas |
| 6,846,539 B2 | 1/2005 | Kim et al. |
| 6,851,466 B2 | 2/2005 | Adachi et al. |
| 6,869,477 B2 | 3/2005 | Haga et al. |
| 6,913,649 B2 | 7/2005 | Voutsas et al. |
| 6,926,876 B2 | 8/2005 | Kelsey |
| 7,001,543 B2 | 2/2006 | Kitahara et al. |
| 2002/0014574 A1 | 2/2002 | Wakita et al. |
| 2002/0100410 A1 | 8/2002 | Kim et al. |
| 2002/0117666 A1 | 8/2002 | Voutsas |
| 2002/0117718 A1 | 8/2002 | Voutsas |
| 2002/0118317 A1 | 8/2002 | Voutsas |
| 2002/0119644 A1 | 8/2002 | Voutsas |
| 2002/0174825 A1 | 11/2002 | Wehrhan |
| 2003/0025134 A1 | 2/2003 | Voutsas |
| 2003/0029376 A1 | 2/2003 | Snyder et al. |
| 2003/0047130 A1 | 3/2003 | Sreedharamurthy et al. |
| 2003/0064551 A1 | 4/2003 | Voutsas |
| 2003/0080451 A1 | 5/2003 | Kitahara et al. |
| 2003/0101924 A1 | 6/2003 | Holder |
| 2003/0133853 A1 | 7/2003 | Kelsey |
| 2003/0209186 A1 | 11/2003 | Haga et al. |
| 2003/0217689 A1 | 11/2003 | Asami |
| 2004/0129201 A1 | 7/2004 | Cho et al. |
| 2004/0211496 A1 | 10/2004 | Khattak et al. |
| 2004/0238150 A1 | 12/2004 | Adachi et al. |
| 2004/0261691 A1 | 12/2004 | Doguchi |
| 2005/0072976 A1 | 4/2005 | Cleeves et al. |
| 2005/0120944 A1 | 6/2005 | Hong et al. |
| 2005/0150445 A1 | 7/2005 | Kim et al. |
| 2005/0211408 A1 | 9/2005 | Bullied et al. |
| 2005/0221569 A1 | 10/2005 | Nakata |
| 2006/0280945 A1 | 12/2006 | Pribat |
| 2007/0028835 A1 | 2/2007 | Yamauchi et al. |

FOREIGN PATENT DOCUMENTS

| | | |
|---|---|---|
| DE | 39 29 635 A1 | 3/1991 |
| DE | 10 2006 01762 | 10/2007 |
| EP | 0 233 452 | 8/1987 |
| EP | 0 399 054 61 | 11/1990 |
| EP | 0 450 494 A1 | 10/1991 |
| EP | 0 573 943 B1 | 12/1993 |
| EP | 0 745 707 A1 | 12/1996 |
| EP | 0 748 884 A1 | 12/1996 |
| EP | 0 781 866 A2 | 7/1997 |
| EP | 0 782 178 B1 | 7/1997 |
| JP | 62-167213 | 7/1987 |
| JP | 6-191820 | 7/1994 |
| JP | 7053294 | 2/1995 |
| JP | 7069778 | 3/1995 |
| JP | 7138011 | 5/1995 |
| JP | 7172998 | 7/1995 |
| JP | 8104590 | 4/1996 |
| JP | 9235181 | 9/1997 |
| JP | 11-240710 | 9/1999 |
| JP | 2000-119089 | 4/2000 |
| JP | 2000-169281 | 6/2000 |
| JP | 2001-019591 | 1/2001 |
| JP | 2001-198648 | 7/2001 |
| JP | 2002-220296 | 8/2002 |
| JP | 2003-212691 | 7/2003 |
| JP | 2005046851 | 2/2005 |
| JP | 2005046866 | 2/2005 |
| JP | 2005-095924 | 4/2005 |
| JP | 2005-104743 | 4/2005 |
| JP | 2005-152987 | 6/2005 |
| JP | 2005-211937 | 8/2005 |
| JP | 2005-281068 | 10/2005 |
| JP | 2005-350317 | 12/2005 |
| JP | 2006-83024 | 3/2006 |
| JP | 2006-131433 | 5/2006 |
| JP | 2006-182626 | 7/2006 |
| JP | 2006-219352 | 8/2006 |
| JP | 2007-076928 | 3/2007 |
| TW | 224866 | 12/2004 |
| WO | WO 01/63022 A2 | 8/2001 |
| WO | WO 01/68957 A1 | 9/2001 |
| WO | WO 02/059400 A2 | 8/2002 |
| WO | WO 03/021011 A1 | 3/2003 |
| WO | WO 03/044249 A1 | 5/2003 |
| WO | WO 03/106012 A1 | 12/2003 |
| WO | WO 2006/005416 | 1/2006 |
| WO | WO 2006093099 | 9/2006 |

OTHER PUBLICATIONS

T.F. Ciszek et al., "Directionally Solidified Solar-Grade Silicon Using Carbon Crucibles," Journal of Crystal Growth, vol. 46, 1979, pp. 527-533.

G. Dour et al., "Relaxation of Thermal Stresses by Dislocation Flow and Multiplication in the Continuous Casting of Silicon," Modeling and Simulation in Materials Science and Engineering, vol. 5, No. 3, May 1997, pp. 275-288.

F. Durand, "Electromagnetic Continuous Pulling Process Compared to Current Casting Processes with Respect to Solidification Characteristics," Solar Energy Materials and Solar Cells, vol. 72, No. 1-4, pp. 125-132.

Shinji Goda et al., "Production of low Cost Silicon Wafers by Continuous Casting Method—Development of Drip Controlled Method,"1994 IEEE First World Conference on Photovoltaic Energy Conversion Conference Record of the IEEE Photovoltaic Specialists, Conference v 2 1994, pp. 1227-1233.

D. N. Jewett et al., "Low Cost Solar Array Project. Task I. Silicon Material. Gaseous Melt Replenishment System. Fifth Quarterly Progress Report, Apr. 17-Jul. 17, 1980," Energy Materials Corp., Harvard, MA.

(56) References Cited

OTHER PUBLICATIONS

M. Kitamura et al., "Growth of Multicrystalline Si with Controlled Grain Boundary Configuration by the Floating Zone Technique," Journal of Crystal Growth, vol. 280, 2005, pp. 419-424.

I. Perichaud et al., "Microstructure and Electrical Properties of Some Multicyrstalline Silicon Billets Continuously Cast in a Cold Crucible," Diffusion and Defect Data Part B (Solid State Phenomena) Conference Title: Diffus. Defect Data B. Solid State Phenom. (Switzerland), vol. 51-52, 1996, pp. 473-477.

K. Shibuya et al., "Development of a Rapid Solidification Process with a Double-Roller Method," Material Science and Engineering, vol. 98, Feb. 1988; pp. 25-28.

J.S. Shin et al., "Numerical and Experimental Study of the Electromagnetic Continuous Casting of Silicon," Materials Science Forum Conference Title: Mater. Sci. Forum (Switzerland), vol. 475-479, pt. 4, 2005, pp. 2671-2674.

T.F. Ciszek, "Some Applications of Cold Crucible Technology for Silicon Photovoltaic Material Preparation," Journal of Electrochemical Society, vol. 132, No. 4, Apr. 1985, pp. 963-968.

METHODS FOR MANUFACTURING MONOCRYSTALLINE OR NEAR-MONOCRYSTALLINE CAST MATERIALS

This invention claims the benefit of priority from U.S. Provisional Application No. 60/951,926, filed Jul. 25, 2007, the entirety of which is expressly incorporated herein by reference.

This invention was made with U.S. Government support under National Renewable Energy Laboratory (NREL) Subcontract No. ZDO-2-30628-03 under Department of Energy (DOE) Contract No. DE-AC36-98GO10337, awarded by DOE. The U.S. Government has certain rights in this invention.

TECHNICAL FIELD

The present invention generally relates to the field of photovoltaics and to methods and apparatuses for manufacturing cast silicon for photovoltaic applications. The invention further relates to new forms of cast silicon that can be used to manufacture devices, such as photovoltaic cells and other semiconductor devices. The new silicon can have a monocrystalline structure and can be manufactured by a casting process.

BACKGROUND INFORMATION

Photovoltaic cells convert light into electric current. One of the most important measures of a photovoltaic cell is its efficiency in converting light energy into electrical energy. Although photovoltaic cells can be fabricated from a variety of semiconductor materials, silicon is generally used because it is readily available at reasonable cost, and because it has a suitable balance of electrical, physical, and chemical properties for use in fabricating photovoltaic cells.

In a known procedure for the manufacture of photovoltaic cells, silicon feedstock is mixed with a material (or dopant) for inducing either a positive or negative conductivity type, melted, and then crystallized by either pulling crystallized silicon out of a melt zone into ingots of monocrystalline silicon (via the Czochralski (CZ) or float zone (FZ) methods), or cast into blocks or "bricks" of multi-crystalline silicon or polycrystalline silicon, depending on the grain size of the individual silicon grains. In the procedure described above, the ingots or blocks are cut into thin substrates, also referred to as wafers, by known slicing or sawing methods. These wafers may then be processed into photovoltaic cells.

Monocrystalline silicon for use in the manufacture of photovoltaic cells is generally produced by the CZ or FZ methods, both being processes in which a cylindrically shaped boule of crystalline silicon is produced. For a CZ process, the boule is slowly pulled out of a pool of molten silicon. For a FZ process, solid material is fed through a melting zone and re-solidified on the other side of the melting zone. A boule of monocrystalline silicon, manufactured in these ways, contains a radial distribution of impurities and defects, such as rings of oxygen-induced stacking faults (OSF) and "swirl" defects of interstitial or vacancy clusters. Even with the presence of these impurities and defects, monocrystalline silicon is generally a preferred source of silicon for producing photovoltaic cells, because it can be used to produce high efficiency solar cells. Monocrystalline silicon is, however, more expensive to produce than conventional multi-crystalline silicon, using known techniques such as those described above.

Conventional multi-crystalline silicon for use in the manufacture of photovoltaic cells is generally produced by a casting process. Casting processes for preparing conventional multi-crystalline silicon are known in the art of photovoltaic technology. Briefly, in such processes, molten silicon is contained in a crucible, such as a quartz crucible, and is cooled in a controlled manner to permit the crystallization of the silicon contained therein. The block of multi-crystalline silicon that results is generally cut into bricks having a cross-section that is the same as or close to the size of the wafer to be used for manufacturing a photovoltaic cell, and the bricks are sawed or otherwise cut into such wafers. The multi-crystalline silicon produced in such manner is an agglomeration of crystal grains where, within the wafers made therefrom, the orientation of the grains relative to one another is effectively random.

The random orientation of grains, in either conventional multi-crystalline or poly-crystalline silicon, makes it difficult to texture the surface of a resulting wafer. Texturing is used to improve efficiency of a photovoltaic cell, by reducing light reflection and improving light energy absorption through the surface a cell. Additionally, "kinks" that form in the boundaries between the grains of conventional multi-crystalline silicon tend to nucleate structural defects in the form of clusters or lines of dislocations. These dislocations, and the impurities they tend to attract, are believed to cause a fast recombination of electrical charge carriers in a functioning photovoltaic cell made from conventional multi-crystalline silicon. This can cause a decrease in the efficiency of the cell. Photovoltaic cells made from such multi-crystalline silicon generally have lower efficiency compared to equivalent photovoltaic cells made from monocrystalline silicon, even considering the radial distribution of defects present in monocrystalline silicon produced by known techniques. However, because of the relative simplicity and lower costs for manufacturing conventional multi-crystalline silicon, as well as effective defect passivation in cell processing, multi-crystalline silicon is a more widely used form of silicon for manufacturing photovoltaic cells.

Some previous casting techniques involved using a "cold-wall" crucible for crystal growth. The term "cold-wall" refers to the fact that induction coils present on or in the walls of the crucible are water cooled, and may also be slotted, thus generally remaining below 100° C. The crucible walls may be situated in close proximity between the coils and the feedstock. The material of the crucible walls is not particularly thermally insulating, and can therefore remain in thermal equilibrium with the cooled coils. The heating of the silicon is therefore not predicated on radiation from the crucible walls, because inductive heating of the silicon in the crucible means that the silicon is heated directly by current induced to flow therein. In this way, the walls of the crucible remain below the melting temperature of the silicon, and are considered "cold," relative to the molten silicon. During solidification of the inductively heated molten silicon, these cold walls of the crucible act as a heat sink. The ingot cools quickly, determined by radiation to the cold walls. Therefore, an initial solidification front quickly becomes substantially curved, with crystal nucleation occurring at the ingot sides and growing diagonally towards the ingot center, disrupting any attempt at maintaining a vertical and geometrically ordered seeding process or a substantially flat solidification front.

In view of the foregoing, there is a need for an improved form of silicon that can be used to manufacture photovoltaic cells. There is also a need for silicon that can be manufactured in a process that is faster and less expensive than the processes that have been heretofore used to produce monocrystalline silicon. The present invention provides such silicon and such processes.

SUMMARY OF THE INVENTION

As used herein, the term "monocrystalline silicon" refers to a body of single crystal silicon, having one consistent crystal orientation throughout. Further, conventional multi-crystalline silicon refers to crystalline silicon having cm-scale grain size distribution, with multiple randomly oriented crystals located within a body of silicon.

Further, as used herein, the term "poly-crystalline silicon" refers to crystalline silicon with micron order grain size and multiple grain orientations located within a given body of silicon. For example, the grains are typically an average of about submicron to submillimeter in size (e.g., individual grains may not be visible to the naked eye), and grain orientation distributed randomly throughout.

Still further, as used herein, the term "near-monocrystalline silicon" refers to a body of crystalline silicon, having one consistent crystal orientation throughout for greater than 50% by volume of the body, where, for example, such near-monocrystalline silicon may comprise a body of single crystal silicon next to a multicrystalline region, or it may comprise a large, contiguously consistent crystal of silicon that partially or wholly contains smaller crystals of silicon of other crystal orientations, where the smaller crystals do not make up more than 50% of the overall volume. Preferably, the near-monocrystalline silicon may contain smaller crystals which do not make up more than 25% of the overall volume. More preferably, the near-monocrystalline silicon may contain smaller crystals which do not make up more than 10% of the overall volume. Still more preferably, the near-monocrystalline silicon may contain smaller crystals which do not make up more than 5% of the overall volume.

As used herein, however, the term "geometrically ordered multi-crystalline silicon" (hereinafter abbreviated as "geometric multi-crystalline silicon") refers to crystalline silicon, according to embodiments of the present invention, having a geometrically ordered cm-scale grain size distribution, with multiple ordered crystals located within a body of silicon. For example, in geometric multi-crystalline silicon, each grain typically has an average cross-sectional area of about 0.25 $cm^2$ to about 2,500 $cm^2$ in size, and a height that can be as large as the body of silicon, for example, the height can be as large as the dimension of the body of silicon that is perpendicular to the plane of the cross-section, with grain orientation within a body of geometric multi-crystalline silicon being controlled according to predetermined orientations. The shape of the cross-section of the grain that is perpendicular to the height or length of the grain of geometric multi-crystalline silicon is typically the same as the shape of the seed crystal or part of a seed crystal over which it was formed. Preferably, the shape of the cross-section of the grain is polygonal. Preferably, the corners of the polygonal grains correspond to junctions of three different grains. Although each grain within a body of geometric multi-crystalline silicon preferably comprises silicon having one contiguously consistent crystal orientation throughout that grain, one or more grains can also contain small amounts of smaller crystals of silicon of different orientation. For example, each such grain can partially or wholly contain smaller crystals of silicon of other crystal orientations, where such smaller crystals do not make up more than 25% of the overall volume of the grain, preferably not more than 10% of the overall volume of the grain, more preferably not more than 5% of the overall volume of the grain, still more preferably not more than 1% of the overall volume of the grain, and still more preferably not more than 0.1% of the overall volume of the grain.

In accordance with the invention as embodied and broadly described, there is provided a method of manufacturing cast silicon, comprising: placing molten silicon in contact with at least one silicon seed crystal in a vessel having one or more side walls heated to at least the melting temperature of silicon and at least one wall for cooling; and forming a solid body of monocrystalline silicon, optionally having at least two dimensions each being at least about 10 cm, by cooling the molten silicon to control crystallization, wherein the forming includes forming a solid-liquid interface at an edge of the molten silicon that at least initially parallels the at least one wall for cooling, the interface being controlled during the cooling so as to move in a direction that increases a distance between the molten silicon and the at least one wall for cooling. It is contemplated that one of the walls of the crucible may be a bottom of the crucible.

In accordance with an embodiment of the present invention, there is also provided a method of manufacturing cast silicon, comprising: placing a geometric arrangement of a plurality of monocrystalline silicon seed crystals on at least one surface in a crucible having one or more side walls heated to at least the melting temperature of silicon and at least one wall for cooling, wherein the geometric arrangement includes close-packed polygons; placing molten silicon in contact with the geometric arrangement of the monocrystalline silicon seed crystals; and forming a solid body of monocrystalline silicon, optionally having at least two dimensions each being at least about 10 cm, by cooling the molten silicon to control crystallization, wherein the forming includes forming a solid-liquid interface at an edge of the molten silicon that parallels the at least one wall for cooling, the interface being controlled during the cooling so as to move in a direction that increases a distance between the molten silicon and the at least one wall for cooling.

In accordance with another embodiment of the present invention, there is also provided a method of manufacturing cast silicon, comprising: arranging a plurality of monocrystalline silicon seed crystals in a predetermined pattern on at least two surfaces of a crucible; placing molten silicon in contact with the monocrystalline silicon seed crystals; and forming a solid body of monocrystalline silicon, optionally having at least two dimensions each being at least about 10 cm, by cooling the molten silicon from the at least two surfaces of the crucible to control crystallization, wherein the forming includes controlling a solid-liquid interface at an edge of the molten silicon during the cooling so as to move in a direction that increases a distance between the molten silicon and the at least two surfaces of the crucible.

In accordance with yet another embodiment of the present invention, there is also provided a method of manufacturing cast silicon, comprising: placing silicon feedstock in contact with at least one monocrystalline silicon seed crystal on at least one surface; heating the silicon feedstock and the at least one monocrystalline silicon seed crystal to the melting temperature of silicon; controlling the heating so that the at least one monocrystalline silicon seed crystal does not melt completely, the controlling comprising maintaining a ΔT of about 0.1° C./min or less, as measured on an outside surface of the crucible, after reaching the melting temperature of silicon elsewhere in the crucible; and, once the at least one monocrystalline silicon seed crystal is partially melted, forming a solid body of monocrystalline silicon by cooling the silicon.

In accordance with still another embodiment of the present invention, there is also provided a method of manufacturing cast silicon, comprising: placing a geometric arrangement of a plurality of monocrystalline silicon seed crystals on at least one surface in a crucible, wherein the geometric arrangement includes close-packed polygons; placing silicon feedstock in contact with the plurality of monocrystalline silicon seed crystals on the at least one surface; heating the silicon feedstock and the plurality of monocrystalline silicon seed crystals to the melting temperature of silicon; controlling the heating so that the plurality of seed crystals does not melt completely, the controlling comprising maintaining a $\Delta T$ of about 0.1° C./min or less, as measured on an outside surface of the crucible, after reaching the melting temperature of silicon elsewhere in the crucible; and, once at least one monocrystalline silicon seed crystal is partially melted, forming a solid body of monocrystalline silicon by cooling the silicon.

In accordance with a further embodiment of the present invention, there is also provided a method of manufacturing cast silicon, comprising: arranging a plurality of monocrystalline silicon seed crystals in a predetermined pattern on at least two surfaces of a crucible; placing silicon feedstock in contact with the plurality of monocrystalline silicon seed crystals on the at least two surfaces; heating the silicon feedstock and the plurality of monocrystalline silicon seed crystals to the melting temperature of silicon; controlling the heating so that the plurality of monocrystalline silicon seed crystals does not melt completely, the controlling comprising maintaining a $\Delta T$ of about 0.1° C./min or less, as measured on an outside surface of the crucible, after reaching the melting temperature of silicon elsewhere in the crucible; and, once the at least one monocrystalline silicon seed crystal is partially melted, forming a solid body of monocrystalline silicon by cooling the silicon.

In accordance with an embodiment of the present invention, there is also provided a method of manufacturing cast silicon, comprising: placing molten silicon in contact with at least one silicon seed crystal in a vessel having one or more side walls heated to at least the melting temperature of silicon, the at least one silicon seed crystal arranged to cover an entire or substantially an entire area of a surface of the vessel; and forming a solid body of monocrystalline silicon, optionally having at least two dimensions each being at least about 10 cm, by cooling the molten silicon to control crystallization.

In accordance with an embodiment of the present invention, there is also provided a body of continuous monocrystalline silicon being free or substantially free of radially-distributed impurities and defects, and having at least two dimensions that are each at least about 25 cm and a third dimension at least about 20 cm.

In accordance with still a further embodiment of the present invention, there is also provided a body of continuous monocrystalline silicon having a carbon concentration of about $2\times10^{16}$ atoms/cm$^3$ to about $5\times10^{17}$ atoms/cm$^3$, an oxygen concentration not exceeding $5\times10^{17}$ atoms/cm$^3$, a nitrogen concentration of at least $1\times10^{15}$ atoms/cm$^3$, and having at least two dimensions that are each at least about 25 cm and a third dimension at least about 20 cm.

In accordance with yet another embodiment of the present invention, there is also provided a body of continuous cast monocrystalline silicon having at least two dimensions that are each at least about 35 cm.

In accordance with another embodiment of the present invention, there is also provided a solar cell, comprising: a wafer formed from a body of continuous monocrystalline silicon being free or substantially free of radially-distributed impurities and defects, the body having at least two dimensions that are each at least about 25 cm and a third dimension at least about 20 cm; a p-n junction in the wafer; an optional anti-reflective coating on a surface of the wafer; optionally at least one layer selected from a back surface field and a passivating layer; and electrically conductive contacts on the wafer.

In accordance with another embodiment of the present invention, there is also provided a solar cell, comprising: a wafer formed from a body of continuous cast monocrystalline silicon, the body having at least two dimensions that are each at least about 35 cm; a p-n junction in the wafer; an optional anti-reflective coating on a surface of the wafer; optionally at least one layer selected from a back surface field and a passivating layer; and electrically conductive contacts on the wafer.

In accordance with another embodiment of the present invention, there is also provided a solar cell, comprising: a continuous monocrystalline silicon wafer formed from a body of continuous cast monocrystalline silicon, the wafer having at least one dimension that is at least about 50 mm, and the body having at least two dimensions that are each at least about 25 cm and a third dimension at least about 20 cm; a p-n junction in the wafer; an optional anti-reflective coating on a surface of the wafer; optionally at least one layer selected from a back surface field and a passivating layer; and electrically conductive contacts on the wafer.

In accordance with another embodiment of the present invention, there is also provided a wafer, comprising: silicon formed from a body of continuous monocrystalline silicon being free or substantially free of radially-distributed impurities and defects, the body having at least two dimensions that are each at least about 25 cm and a third dimension at least about 20 cm.

In accordance with another embodiment of the present invention, there is also provided a wafer, comprising: silicon formed from a body of continuous cast monocrystalline silicon, the wafer having at least one dimension that is at least about 50 mm, and the body having at least two dimensions that are each at least about 25 cm and a third dimension at least about 20 cm.

In accordance with another embodiment of the present invention, there is also provided a method of manufacturing cast silicon, comprising: placing molten silicon in contact with at least one silicon seed crystal in a vessel having one or more side walls heated to at least the melting temperature of silicon and at least one wall for cooling; and forming a solid body of near-monocrystalline silicon, optionally having at least two dimensions each being at least about 10 cm, by cooling the molten silicon to control crystallization, wherein the forming includes forming a solid-liquid interface at an edge of the molten silicon that at least initially parallels the at least one wall for cooling, the interface being controlled during the cooling so as to move in a direction that increases a distance between the molten silicon and the at least one wall for cooling.

In accordance with another embodiment of the present invention, there is also provided a method of manufacturing cast silicon, comprising: placing molten silicon in contact with at least one silicon seed crystal in a vessel having one or more side walls heated to at least the melting temperature of silicon, the at least one silicon seed crystal arranged to cover an entire or substantially an entire area of a surface of the vessel; and forming a solid body of near-monocrystalline silicon, optionally having at least two dimensions each being at least about 10 cm, by cooling the molten silicon to control crystallization.

In accordance with another embodiment of the present invention, there is also provided a body of near-monocrystalline silicon being free or substantially free of radially-distributed impurities and defects, and having at least two dimensions that are each at least about 25 cm and a third dimension at least about 20 cm.

In accordance with another embodiment of the present invention, there is also provided a body of near-monocrystalline silicon having a carbon concentration of about $2\times10^{16}$ atoms/cm$^3$ to about $5\times10^{17}$ atoms/cm$^3$, an oxygen concentration not exceeding $5\times10^{17}$ atoms/cm$^3$, a nitrogen concentration of at least $1\times10^{15}$ atoms/cm$^3$, and having at least two dimensions that are each at least about 25 cm and a third dimension at least about 20 cm.

In accordance with another embodiment of the present invention, there is also provided a body of cast near-monocrystalline silicon having at least two dimensions that are each at least about 35 cm.

In accordance with another embodiment of the present invention, there is also provided a solar cell, comprising: a wafer formed from a body of near-monocrystalline silicon being free or substantially free of radially-distributed impurities and defects, the body having at least two dimensions that are each at least about 25 cm and a third dimension at least about 20 cm; a p-n junction in the wafer; an optional anti-reflective coating on a surface of the wafer; optionally at least one layer selected from a back surface field and a passivating layer; and electrically conductive contacts on the wafer.

In accordance with another embodiment of the present invention, there is also provided a solar cell, comprising: a wafer formed from a body of cast near-monocrystalline silicon, the body having at least two dimensions that are each at least about 35 cm; a p-n junction in the wafer; an optional anti-reflective coating on a surface of the wafer; optionally at least one layer selected from a back surface field and a passivating layer; and electrically conductive contacts on the wafer.

In accordance with another embodiment of the present invention, there is also provided a wafer, comprising: silicon formed from a body of near-monocrystalline silicon being free or substantially free of radially-distributed impurities and defects, the body having at least two dimensions that are each at least about 25 cm and a third dimension at least about 20 cm.

In accordance with another embodiment of the present invention, there is also provided a wafer, comprising: silicon formed from a body of cast near-monocrystalline silicon, the wafer having at least one dimension that is at least about 50 mm, and the body having at least two dimensions that are each at least about 25 cm and a third dimension at least about 20 cm.

In accordance with still a further embodiment of the present invention, there is also provided a solar cell, comprising: a wafer sliced from a body of continuous monocrystalline silicon being substantially free of radially-distributed defects, the body having at least two dimensions that are each at least about 25 cm and a third dimension at least about 20 cm; a p-n junction in the wafer; an optional anti-reflective coating on a surface of the wafer; an optional back surface field; one or more optional passivating layers; and a plurality of electrically conductive contacts on at least one surface of the wafer.

In accordance with yet another embodiment of the present invention, there is also provided a solar cell, comprising: a wafer sliced from a body of continuous cast monocrystalline silicon being substantially free of radially-distributed defects, the body having at least two dimensions that are each at least about 35 cm; a p-n junction in the wafer; an optional anti-reflective coating on a surface of the wafer; an optional back surface field; one or more optional passivating layers; and a plurality of electrically conductive contacts on at least one surface of the wafer.

In accordance with another embodiment of the present invention, there is also provided a solar cell, comprising: a continuous monocrystalline silicon wafer sliced from a body of continuous monocrystalline silicon and being substantially free of radially-distributed defects, the wafer having a least one dimension that is at least about 40 mm, and the body having at least two dimension that are each at least about 25 cm and a third dimension at least about 20 cm; a p-n junction in the wafer; and optional anti-reflective coating on a surface of the wafer; an optional back surface field; one or more optional passivating layers; and a plurality of electrically conductive contacts on at least one surface of the wafer.

In accordance with another embodiment of the present invention, near-monocrystalline silicon made according to the invention can contain up to 5% by volume of smaller crystals of silicon of other crystal orientations. Preferably, in accordance with another embodiment of the present invention, near-monocrystalline silicon made according to the invention can contain up to 1% by volume of smaller crystals of silicon of other crystal orientations. Still more preferably, in accordance with another embodiment of the present invention, near-monocrystalline silicon made according to the invention can contain up to 0.1% by volume of smaller crystals of silicon of other crystal orientations.

Additional features and advantages of the invention will be set forth in the description that follows, being apparent from the description or learned by practice of embodiments of the invention. The features and other advantages of the invention will be realized and attained by the semiconductor device structures and methods and apparatuses of manufacture particularly pointed out in the written description and claims, as well as the appended drawings.

It is to be understood that both the foregoing general description and the following detailed description are exemplary and explanatory, and are intended to provide further explanation of the invention as claimed. This invention also includes silicon made by the methods described and claimed herein, and wafers and solar cells made from such silicon.

BRIEF DESCRIPTION OF THE DRAWINGS

The accompanying drawings, which are incorporated in and constitute a part of this specification, illustrate embodiments of the invention and, together with the description, serve to explain the features, advantages, and principles of the invention. In the drawings.

DESCRIPTION OF THE EMBODIMENTS

Figure 1:
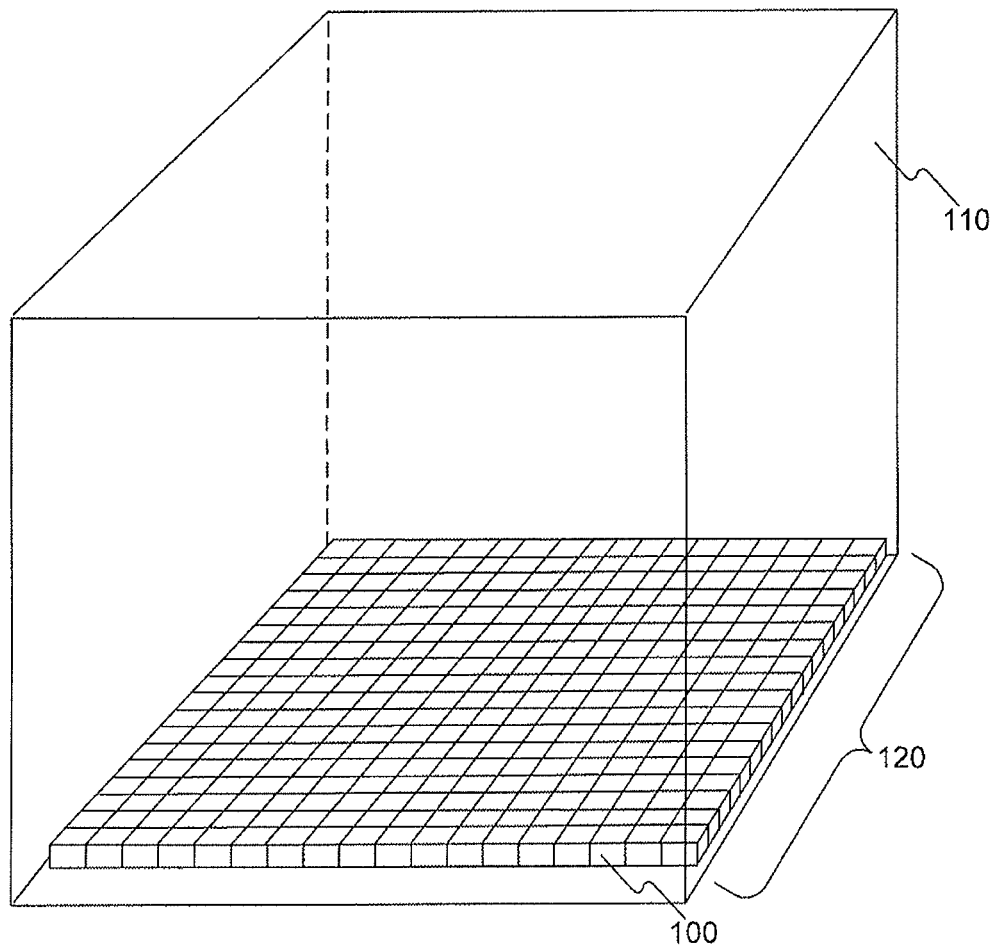
FIG. 1 illustrates an exemplary arrangement of silicon seeds on the bottom surface of a crucible, according to an embodiment of the present invention.

Reference will now be made in detail to embodiments of the present invention, examples of which are illustrated in the accompanying drawings. Wherever possible, the same or similar reference numbers will be used throughout the drawings to refer to the same or like parts.

In embodiments consistent with the invention, the crystallization of molten silicon is conducted by casting processes using one or more seed crystals. As disclosed herein, such casting processes may be implemented so that the size, shape, and orientation of crystal grains in the cast body of crystallized silicon is controlled. As used herein, the term "cast" means that the silicon is formed by cooling molten silicon in a mold or vessel used to hold the molten silicon. Since a liquid, such as molten silicon, will take the shape of the container in which it is placed, it is also contemplated herein that the cooling of molten silicon may also be accomplished while confining the molten silicon by any means, and not just in a mold or vessel. By way of example, the silicon can be formed by solidification in a crucible, where solidification is initiated from at least one wall of the crucible, and not through a cooled foreign object introduced into the melt. The crucible may have any suitable shape, such as a cup, a cylinder, or a box. Thus, the process of molten silicon crystallization according to this invention is not controlled by "pulling" a boule or ribbon. Further, consistent with an embodiment of the present invention, the mold, vessel, or crucible includes at least one "hot side wall" surface in contact with the molten silicon. As used herein, the term "hot side wall" refers to a surface that is isothermal with or hotter than the molten silicon that it contacts. Preferably, a hot side wall surface remains fixed during processing of the silicon.

Consistent with embodiments of the invention, the crystallized silicon can be either continuous monocrystalline, near-monocrystalline silicon, or continuous geometric multi-crystalline having controlled grain orientations. As used herein, the term "continuous monocrystalline silicon" refers to single crystal silicon, where the body of silicon is one homogeneous body of monocrystalline silicon and not smaller pieces of silicon joined together to form a larger piece of silicon. Further, as used herein, the term "continuous geometric multi-crystalline silicon" refers to geometric multi-crystalline silicon where the body of silicon is one homogeneous body of geometric multi-crystalline silicon and not smaller pieces of silicon joined together to form a larger piece of silicon.

Consistent with embodiments of the present invention, the crystallization can be accomplished by positioning a desired collection of crystalline silicon "seeds" in, for example, the bottom of a vessel, such as a quartz crucible that can hold molten silicon. As used herein, the term "seed" refers to a preferably geometrically shaped piece of silicon with a desired crystal structure, preferably wherein at least one cross-section has a geometric, preferably polygonal, shape, and preferably having a side that conforms to a surface of a vessel in which it may be placed. Such a seed can be either a monocrystalline piece of silicon or a piece of geometrically ordered multi-crystalline silicon, for example, a slab or horizontal section cut or otherwise obtained from an ingot of monocrystalline silicon. Consistent with the present invention, a seed may have a top surface that is parallel to its bottom surface, although this does not have to be the case. For example, a seed can be a piece of silicon, varying in size from about 2 mm to about 3000 mm across. For example, a seed can be about 10 mm to about 300 mm across. The piece of silicon may have a thickness of about 1 mm to about 1000 mm, preferably about 5 mm to about 50 mm. A suitable size and shape of the seed may be selected for convenience and tiling. Tiling, which will be described in more detail below, is where silicon seed crystals are arranged in a predetermined geometric orientation or pattern across, for example, the bottom or one or more of the sides and the bottom surfaces of a crucible. It is preferable that the seed or seeds cover the entire crucible surface next to which they are located, so that when moving the seeded crystal growth solidification front away from the seeds, the full size of the crucible cross-section can be maintained as a consistent geometric crystal.

The molten silicon is then allowed to cool and crystallize in the presence of the seeds, preferably in a manner such that the cooling of the molten silicon is conducted so that the crystallization of the molten silicon starts at or below the level of the original top of the solid seeds and proceeds away, preferably upwards away, from the seeds. The solid-liquid interface at an edge of the molten silicon will preferably initially conform to a cooling surface of the vessel, such as a surface in a crucible, in which it is being cast. According to embodiments of the invention, the liquid-solid interface between the molten silicon and the crystallized silicon can be maintained substantially flat throughout part, for example, the initial part of the solidification stage, or all of the casting process. In an embodiment of the invention, the solid-liquid interface at each of the edges of the molten silicon is controlled during the cooling so as to move in a direction that increases a distance between the molten silicon and the cooled surface of the crucible while preferably maintaining a substantially flat solid-liquid interface.

Therefore, consistent with the present invention, the solidification front may parallel the shape of a cooled surface of the vessel. For example, with a flat-bottomed crucible, the solidification front may remain substantially flat, with the solid-liquid interface having a controlled profile. The solid-liquid interface can be controlled so that its radius of curvature decreases as one moves from the edge to the center. Alternatively, the solid-liquid interface can be controlled to maintain an average radius of curvature of at least half the width of the vessel. Moreover, the solid-liquid interface can be controlled to maintain an average radius of curvature of at least twice the width of the vessel. The solid can have a slightly convex interface with a radius of curvature at least about four times the width of the vessel. For example, the solid-liquid interface can have a radius of curvature generally greater than 2 m in a 0.7 m square crucible, more than twice the horizontal dimension of the crucible, and preferably about 8× to about 16× a horizontal dimension of the crucible.

According to embodiments of the present invention, a solid body of monocrystalline silicon, or near-monocrystalline silicon, preferably cast, preferably having at least two dimensions each being at least about 20 cm, for example, at least about 20 cm on a side, and a third dimension at least about 10 cm, can be formed. Preferably, a solid body of monocrystalline silicon, or near-monocrystalline silicon, preferably cast, having at least two dimensions each being at least about 30 cm, for example, at least about 30 cm on a side, and a third dimension at least about 10 cm, can be formed. More preferably, a solid body of monocrystalline silicon, or near-monocrystalline silicon, preferably cast, having at least two dimensions each being at least about 35 cm, for example, at least about 35 cm on a side, and a third dimension at least about 10 cm, can be formed. Still more preferably, a solid body of monocrystalline silicon, or near-monocrystalline silicon, preferably cast, having at least two dimensions each being at least about 40 cm, for example, at least about 40 cm on a side, and a third dimension at least about 20 cm, can be formed. Still more preferably, a solid body of monocrystalline silicon, or near-monocrystalline silicon, preferably cast, having at least two dimensions each being at least about 50 cm, for example, at least about 50 cm on a side, and a third dimension at least about 20 cm, can be formed. Still more preferably, a solid body of monocrystalline silicon, or near-monocrystalline silicon, preferably cast, having at least two dimensions each being at least about 60 cm, for example, at least about 60 cm on a side, and a third dimension at least about 20 cm, can be formed. Still more preferably, a solid body of monocrystalline silicon, or near-monocrystalline silicon, preferably cast, having at least two dimensions each being at least about 70 cm, for example, at least about 70 cm on a side, and a third dimension at least about 20 cm, can be formed. According to embodiments of the present invention, a body of continuous monocrystalline silicon, or near-monocrystalline silicon, being free, or substantially free, of radially-distributed defects and/or impurities, preferably having at least two dimensions each being at least about 20 cm, and a third dimension at least about 10 cm, can be formed. Preferably, a body of continuous monocrystalline silicon, or near-monocrystalline silicon, being free, or substantially free, of radially-distributed defects and/or impurities, having at least two dimensions each being at least about 30 cm, and a third dimension at least about 10 cm, can be formed. More preferably, a body of continuous monocrystalline silicon, or near-monocrystalline silicon, being free, or substantially free, of radially-distributed defects and/or impurities, having at least two dimensions each being at least about 35 cm, and a third dimension at least about 10 cm, can be formed. Still more preferably, a body of continuous monocrystalline silicon, or near-monocrystalline silicon, being free, or substantially free, of radially-distributed defects and/or impurities, having at least two dimensions each being at least about 40 cm, and a third dimension at least about 20 cm, can be formed. Still more preferably, a body of continuous monocrystalline silicon, or near-monocrystalline silicon, being free, or substantially free, of radially-distributed defects and/or impurities, having at least two dimensions each being at least about 50 cm, and a third dimension at least about 20 cm, can be formed. Still more preferably, a body of continuous monocrystalline silicon, or near-monocrystalline silicon, being free, or substantially free, of radially-distributed defects and/or impurities, having at least two dimensions each being at least about 60 cm, and a third dimension at least about 20 cm, can be formed. Still more preferably, a body of continuous monocrystalline silicon, or near-monocrystalline silicon, being free, or substantially free, of radially-distributed defects and/or impurities, having at least two dimensions each being at least about 70 cm, and a third dimension at least about 20 cm, can be formed.

An upper limit of horizontal size of an ingot of cast silicon made according to embodiments of the invention is only determined by casting and crucible making technology, and not by the invented method itself. Ingots having a cross-sectional area of at least 1 m$^2$ and up to 4-8 m$^2$ can be manufactured according to this invention. Similarly, an upper limit of the height of the ingot may be related to longer cycle times, and not the fundamentals of the casting process. Ingot heights of up to about 50 cm to about 80 cm are possible. Thus, consistent with the invention, a body of continuous monocrystalline silicon, or near-monocrystalline silicon, can be successfully grown to about 66 cm×66 cm in cross section, with a rectangular solid piece of continuous monocrystalline silicon being at least 33,750 cm$^3$ in volume. Further, consistent with the present invention, a solid body of cast continuous monocrystalline silicon, or near-monocrystalline silicon, can be formed preferably having at least two dimensions each being as large as the interior dimensions of a casting vessel and the third dimension being the same height as the ingot. For example, if the cast body of monocrystalline silicon is a cube-shaped or a rectangular-shaped solid, these dimensions above would refer to the length, width, and height of such bodies.

Similarly, a solid body of cast geometric multi-crystalline silicon, preferably having at least two dimensions each being at least about 10 cm, and a third dimension at least about 5 cm, can be formed. Preferably, a solid body of cast geometric multi-crystalline silicon, having at least two dimensions each being at least about 20 cm, and a third dimension at least about 5 cm, can be formed. More preferably, a solid body of cast geometric multi-crystalline silicon, having at least two dimensions each being at least about 30 cm, and a third dimension at least about 5 cm, can be formed. Still more preferably, a solid body of cast geometric multi-crystalline silicon, having at least two dimensions each being at least about 35 cm, and a third dimension at least about 5 cm, can be formed. Still more preferably, a solid body of cast geometric multi-crystalline silicon, having at least two dimensions each being at least about 40 cm, and a third dimension at least about 5 cm, can be formed. Still more preferably, a solid body of cast geometric multi-crystalline silicon, having at least two dimensions each being at least about 50 cm, and a third dimension at least about 5 cm, can be formed. Still more preferably, a solid body of cast geometric multi-crystalline silicon, having at least two dimensions each being at least about 60 cm, and a third dimension at least about 5 cm, can be formed. Still more preferably, a solid body of cast geometric multi-crystalline silicon, having at least two dimensions each being at least about 70 cm, and a third dimension at least about 5 cm, can be formed. Thus, consistent with the invention, a body of continuous geometric multi-crystalline silicon can be successfully grown to about 66 cm×66 cm in cross section, with a rectangular solid piece of continuous geometric multi-crystalline silicon being at least 33,750 cm$^3$ in volume. Further, consistent with the present invention, a solid body of cast geometric multi-crystalline silicon can be formed preferably having at least two dimensions each being as large as the interior dimensions of a casting vessel. For example, if the cast body of geometric multi-crystalline silicon is a cube-shaped or a rectangular-shaped solid, these dimensions above would refer to the length, width, and height of such bodies.

By conducting the crystallization of the molten silicon in a manner consistent with embodiments of the invention, cast silicon having specific, rather than random, grain boundaries and specific grain sizes can be made. Additionally, by aligning the seed(s) in a manner such that all seeds are oriented the same relative direction to each other, for example the (100) pole direction being perpendicular to a bottom of the crucible and the (110) pole direction parallel to one of the sides of a rectangular or square cross-section crucible, large bodies of cast silicon can be obtained that are, or are nearly, monocrystalline silicon in which the pole direction of such cast silicon is the same as that of the seed(s). Similarly, other pole directions may be perpendicular to the bottom of the crucible. Moreover, consistent with an embodiment of the invention, the seed(s) may be arranged so that any common pole direction is perpendicular to a bottom of the crucible.

When monocrystalline silicon is made by the conventional method of pulling a cylindrically shaped boule from a pool of molten silicon, e.g., according to the CZ or FZ methods, the monocrystalline silicon obtained contains radially distributed impurities and defects, such as swirl defects (formed from intrinsic defects such as vacancies and self-interstitial atoms) and OSF ring defects. Swirl defects are interstitial silicon atoms or vacancies, either in singular or clustered form. Such swirl defects can be detected by x-ray topography and appear as "swirls" in the silicon. They can also be detected after preferential acid etching of the silicon for defect delineation.

According to the conventional CZ or FZ methods, the distribution of oxygen atoms within the silicon and the defects in the silicon caused by such oxygen atoms are radially situated. This means that they tend to be arranged in rings, spirals or striations that are symmetric about a central axis. OSF ring defects are a particular example of this, where nanometer-scale oxygen precipitates nucleate stacking faults in a cylindrical band within a pulled monocrystalline ingot or boule of silicon, resulting in circular defect bands on wafers made from such silicon. Such bands can be observed in a sample of silicon after preferential acid etching.

Both swirl defects and OSF ring defects occur in the boules of monocrystalline silicon by pulling a cylindrically shaped boule from a pool of molten silicon, e.g., according to the conventional CZ or FZ methods, due to the rotational symmetry of the pulling process, the axial thermal gradients, and the rotation inherent in the process. In contrast, silicon can be made by casting processes according to embodiments of the invention that does not exhibit such swirl defects and OSF ring defects. This is because the incorporation of defects during the casting process can be essentially distributed randomly at a growth interface not influenced by rotation, in a body of silicon that does not possess cylindrical symmetry, and in a process where the isotherms are essentially flat across the ingot throughout the solidification and the cool-down processes.

Concerning the concentrations of light element impurities in silicon grown by different methods, the following levels, shown in TABLE 1, are widely considered characteristic.

TABLE 1

| | Concentrations (atoms/cm$^3$) | | |
|---|---|---|---|
| | Oxygen | Carbon | Nitrogen |
| Float Zone | $<1 \times 10^{16}$ | $<1 \times 10^{16}$ | $<1 \times 10^{14}$ |
| Czochralski | $2 \times 10^{17}$-$1 \times 10^{18}$ | $<1 \times 10^{16}$ | $<5 \times 10^{14}$ |
| Cast | $2$-$3 \times 10^{17}$ | $2 \times 10^{16}$-$5 \times 10^{17}$ | $>1 \times 10^{15}$ |

Parts of CZ ingots can be produced with as low as $5 \times 10^{17}$ atoms/cm$^3$ of oxygen, but not lower. Carbon and nitrogen concentrations can be increased in FZ and CZ ingots by intentional doping, but doping does not exceed the solid solubility limit in these techniques (as it does in cast material), and doped ingots have not been made in sizes larger than 20 cm diameter. By contrast, cast ingots are typically supersaturated with carbon and nitrogen due to release coatings and the design of the furnace hot zone. As a consequence, precipitated nitrides and carbides are ubiquitous due to liquid phase nucleation and growth. Furthermore, cast single crystal ingots have been manufactured, according to embodiments of the invention, with the above-reported impurity levels and with sizes as large as 50×50×20 cm$^3$ and 60×60×5 cm$^3$. These dimensions are exemplary only, and are not considered upper limits for the casting processes of the invention.

For example, regarding impurity levels, a dissolved carbon concentration of about $1$-$5 \times 10^{17}$ atoms/cm$^3$ (notation for about $1 \times 10^{17}$ atoms/cm$^3$ to about $5 \times 10^{17}$ atoms/cm$^3$), a dissolved oxygen concentration of about $2$-$3 \times 10^{17}$ atoms/cm$^3$, and a dissolved nitrogen concentration of about $1$-$5 \times 10^{15}$ atoms/cm$^3$ are preferred in the silicon cast according to this invention. According to embodiments of the present invention, a solid body of monocrystalline silicon, or near-monocrystalline silicon, preferably cast, preferably having at least two dimensions each being at least about 20 cm, for example, at least about 20 cm on a side, and a third dimension at least about 10 cm, can be formed, having a dissolved carbon concentration of about $1$-$5 \times 10^{17}$ atoms/cm$^3$, a dissolved oxygen concentration of about $2$-$3 \times 10^{17}$ atoms/cm$^3$, and a dissolved nitrogen concentration of about $1$-$5 \times 10^{15}$ atoms/cm$^3$. Preferably, a solid body of monocrystalline silicon, or near-monocrystalline silicon, preferably cast, having at least two dimensions each being at least about 30 cm, for example, at least about 30 cm on a side, and a third dimension at least about 10 cm, can be formed, having a dissolved carbon concentration of about $1$-$5 \times 10^{17}$ atoms/cm$^3$, a dissolved oxygen concentration of about $2$-$3 \times 10^{17}$ atoms/cm$^3$, and a dissolved nitrogen concentration of about $1$-$5 \times 10^{15}$ atoms/cm$^3$. More preferably, a solid body of monocrystalline silicon, or near-monocrystalline silicon, preferably cast, having at least two dimensions each being at least about 35 cm, for example, at least about 35 cm on a side, and a third dimension at least about 10 cm, can be formed, having a dissolved carbon concentration of about $1$-$5 \times 10^{17}$ atoms/cm$^3$, a dissolved oxygen concentration of about $2$-$3 \times 10^{17}$ atoms/cm$^3$, and a dissolved nitrogen concentration of about $1$-$5 \times 10^{15}$ atoms/cm$^3$. Still more preferably, a solid body of monocrystalline silicon, or near-monocrystalline silicon, preferably cast, having at least two dimensions each being at least about 40 cm, for example, at least about 40 cm on a side, and a third dimension at least about 20 cm, can be formed, having a dissolved carbon concentration of about $1$-$5 \times 10^{17}$ atoms/cm$^3$, a dissolved oxygen concentration of about $2$-$3 \times 10^{17}$ atoms/cm$^3$, and a dissolved nitrogen concentration of about $1$-$5 \times 10^{15}$ atoms/cm$^3$. Still more preferably, a solid body of monocrystalline silicon, or near-monocrystalline silicon, preferably cast, having at least two dimensions each being at least about 50 cm, for example, at least about 50 cm on a side, and a third dimension at least about 20 cm, can be formed, having a dissolved carbon concentration of about $1$-$5 \times 10^{17}$ atoms/cm$^3$, a dissolved oxygen concentration of about $2$-$3 \times 10^{17}$ atoms/cm$^3$, and a dissolved nitrogen concentration of about $1$-$5 \times 10^{15}$ atoms/cm$^3$. Still more preferably, a solid body of monocrystalline silicon, or near-monocrystalline silicon, preferably cast, having at least two dimensions each being at least about 60 cm, for example, at least about 60 cm on a side, and a third dimension at least about 20 cm, can be formed, having a dissolved carbon concentration of about $1$-$5 \times 10^{17}$ atoms/cm$^3$, a dissolved oxygen concentration of about $2$-$3 \times 10^{17}$ atoms/cm$^3$, and a dissolved nitrogen concentration of about $1$-$5 \times 10^{15}$ atoms/cm$^3$. Still more preferably, a solid body of monocrystalline silicon, or near-monocrystalline silicon, preferably cast, having at least two dimensions each being at least about 70 cm, for example, at least about 70 cm on a side, and a third dimension at least about 20 cm, can be formed, having a dissolved carbon concentration of about $1$-$5 \times 10^{17}$ atoms/cm$^3$, a dissolved oxygen concentration of about $2$-$3 \times 10^{17}$ atoms/cm$^3$, and a dissolved nitrogen concentration of about $1$-$5 \times 10^{15}$ atoms/cm$^3$.

According to embodiments of the present invention, a body of continuous monocrystalline silicon, or near-monocrystalline silicon, being free, or substantially free, of radially-distributed defects and/or impurities, preferably having at least two dimensions each being at least about 20 cm, and a third dimension at least about 10 cm, can be formed, having a dissolved carbon concentration of about $1-5\times10^{17}$ atoms/cm$^3$, a dissolved oxygen concentration of about $2-3\times10^{17}$ atoms/cm$^3$, and a dissolved nitrogen concentration of about $1-5\times10^{15}$ atoms/cm$^3$. Preferably, a body of continuous monocrystalline silicon, or near-monocrystalline silicon, being free, or substantially free, of radially-distributed defects and/or impurities, having at least two dimensions each being at least about 30 cm, and a third dimension at least about 10 cm, can be formed, having a dissolved carbon concentration of about $1-5\times10^{17}$ atoms/cm$^3$, a dissolved oxygen concentration of about $2-3\times10^{17}$ atoms/cm$^3$, and a dissolved nitrogen concentration of about $1-5\times10^{15}$ atoms/cm$^3$. More preferably, a body of continuous monocrystalline silicon, or near-monocrystalline silicon, being free, or substantially free, of radially-distributed defects and/or impurities, having at least two dimensions each being at least about 35 cm, and a third dimension at least about 10 cm, can be formed, having a dissolved carbon concentration of about $1-5\times10^{17}$ atoms/cm$^3$, a dissolved oxygen concentration of about $2-3\times10^{17}$ atoms/cm$^3$, and a dissolved nitrogen concentration of about $1-5\times10^{15}$ atoms/cm$^3$. Still more preferably, a body of continuous monocrystalline silicon, or near-monocrystalline silicon, being free, or substantially free, of radially-distributed defects and/or impurities, having at least two dimensions each being at least about 40 cm, and a third dimension at least about 20 cm, can be formed, having a dissolved carbon concentration of about $1-5\times10^{17}$ atoms/cm$^3$, a dissolved oxygen concentration of about $2-3\times10^{17}$ atoms/cm$^3$, and a dissolved nitrogen concentration of about $1-5\times10^{15}$ atoms/cm$^3$. Still more preferably, a body of continuous monocrystalline silicon, or near-monocrystalline silicon, being free, or substantially free, of radially-distributed defects and/or impurities, having at least two dimensions each being at least about 50 cm, and a third dimension at least about 20 cm, can be formed, having a dissolved carbon concentration of about $1-5\times10^{17}$ atoms/cm$^3$, a dissolved oxygen concentration of about $2-3\times10^{17}$ atoms/cm$^3$, and a dissolved nitrogen concentration of about $1-5\times10^{15}$ atoms/cm$^3$. Still more preferably, a body of continuous monocrystalline silicon, or near-monocrystalline silicon, being free, or substantially free, of radially-distributed defects and/or impurities, having at least two dimensions each being at least about 60 cm, and a third dimension at least about 20 cm, can be formed, having a dissolved carbon concentration of about $1-5\times10^{17}$ atoms/cm$^3$, a dissolved oxygen concentration of about $2-3\times10^{17}$ atoms/cm$^3$, and a dissolved nitrogen concentration of about $1-5\times10^{15}$ atoms/cm$^3$. Still more preferably, a body of continuous monocrystalline silicon, or near-monocrystalline silicon, being free, or substantially free, of radially-distributed defects and/or impurities, having at least two dimensions each being at least about 70 cm, and a third dimension at least about 20 cm, can be formed, having a dissolved carbon concentration of about $1-5\times10^{17}$ atoms/cm$^3$, a dissolved oxygen concentration of about $2-3\times10^{17}$ atoms/cm$^3$, and a dissolved nitrogen concentration of about $1-5\times10^{15}$ atoms/cm$^3$.

An upper limit of horizontal size of an ingot of cast silicon made according to embodiments of the invention, and having the above-referenced impurity concentrations, is only determined by casting and crucible making technology, and not by the invented method itself. Thus, consistent with the present invention, a solid body of cast continuous monocrystalline silicon, or near-monocrystalline silicon, having the above-referenced impurity concentrations, can be formed preferably having at least two dimensions each being as large as the interior dimensions of a casting vessel and the third dimension being the same height as the ingot. For example, if the cast body of monocrystalline silicon is a cube-shaped or a rectangular-shaped solid, these dimensions above would refer to the length, width, and height of such bodies.

The seed(s) used for casting processes, consistent with embodiments of the invention, can be of any desired size and shape, but are suitably geometrically shaped pieces of monocrystalline silicon, near-monocrystalline silicon, or geometrically ordered multi-crystalline silicon, such as square, rectangular, hexagonal, rhomboid or octagonal shaped pieces of silicon. They can be shaped conducive to tiling, so they can be placed or "tiled" edge-to-edge and conformed to the bottom of a crucible in a desired pattern. Also consistent with embodiments of the invention, seeds can be placed on one or more, including all, sides of the crucible. Such seeds can be obtained, for example, by sawing a source of crystalline silicon, such as a boule of monocrystalline silicon, into pieces having the desired shapes. The seeds can also be formed by cutting them from a sample of either continuous monocrystalline, near-monocrystalline silicon, or continuous geometric multi-crystalline silicon made by a process according to embodiments of the invention, such that seed(s) for use in subsequent casting processes can be made from an initial casting process. Thus, for example, a slab of either continuous monocrystalline or near-monocrystalline silicon cut or otherwise obtained from an ingot of continuous monocrystalline or near-monocrystalline silicon can function as a template for a subsequent casting of continuous monocrystalline or near-monocrystalline silicon. Such a seed crystal can be the size and shape, or substantially the size and shape, of a side, such as the bottom, of a crucible or other vessel in which the seed is placed. For the purposes of monocrystalline casting, it is preferable to have as few seeds as possible to cover the crucible bottom in order to avoid the incorporation of defects. Thus, the seed or seeds can be the size and shape, or substantially the size and shape, of one or more sides, such as the bottom, of a crucible or other vessel in which the seed or seeds is placed to perform the casting method in accordance with this invention.

Processes and apparatuses for preparing silicon in accordance with certain embodiments of the invention will now be described. However, it is to be understood that these are not the only ways to form silicon consistent with the principles of the invention.

Referring to FIG. 1, seeds 100 are placed at the bottom of a bottomed and walled crucible 110, such as a quartz crucible, in a way such that either they closely abut in the same orientation so as to form a large, continuously oriented slab 120. Alternatively, they closely abut in pre-selected misorientations so as to produce specific grain boundaries with deliberately chosen grain sizes in the resulting silicon that is produced. That is, for casting of geometric multi-crystalline silicon, the cross-sectional grain size and, preferably, cross-sectional shape of the resulting crystallized geometric multi-crystalline silicon will be equal to or will approximate that of the seeds and the height of the grain can be a long as the dimension of the silicon that is perpendicular to the cross-section. If a geometric multi-crystalline seed crystal, for example, a slab of geometric multi-crystalline silicon cut or otherwise obtained from an ingot of geometric multi-crystalline silicon, is used a seed crystal or seed crystals for casting geometric multi-crystalline silicon, the cross-sectional grain size and, preferably, cross-sectional shape of the grains of the resulting geometric multi-crystalline silicon will approximate the grains in the geometric multi-crystalline seed or seeds. Thus, a slab of geometric multi-crystalline silicon cut or otherwise obtained from an ingot of geometric multi-crystalline silicon can be a "geometric multi-crystalline silicon seed crystal" (also referred to as a "geometrically ordered multi-crystalline silicon seed crystal"), and can function as a template for a subsequent casting of geometric multi-crystalline silicon. Such a seed crystal can be the size and shape, or substantially the size and shape, of a side, such as the bottom, of a crucible or other vessel in which the seed is placed. When such a seed crystal is used in the method of this invention, the resulting geometric multi-crystalline silicon will preferably have crystal grains that have the same or substantially the same cross-sectional size and shape as the grains in the seed.

Preferably, seeds 100 are tiled and placed so as to substantially cover the entirety of the bottom of crucible 110. It is also preferable that crucible 110 has a release coating such as one made from silica, silicon nitride, or a liquid encapsulant, to aid in the removal of crystallized silicon from crucible 110. Further, the seeds may comprise a slab or slabs of monocrystalline silicon of a desired crystal orientation, about 3 mm to about 100 mm thick. While a specific number and size of seeds 100 is shown in FIG. 1, it will be readily apparent to one of ordinary skill in the art that both the number and size of the seeds can be increased or decreased, depending on the application.

Figure 2:
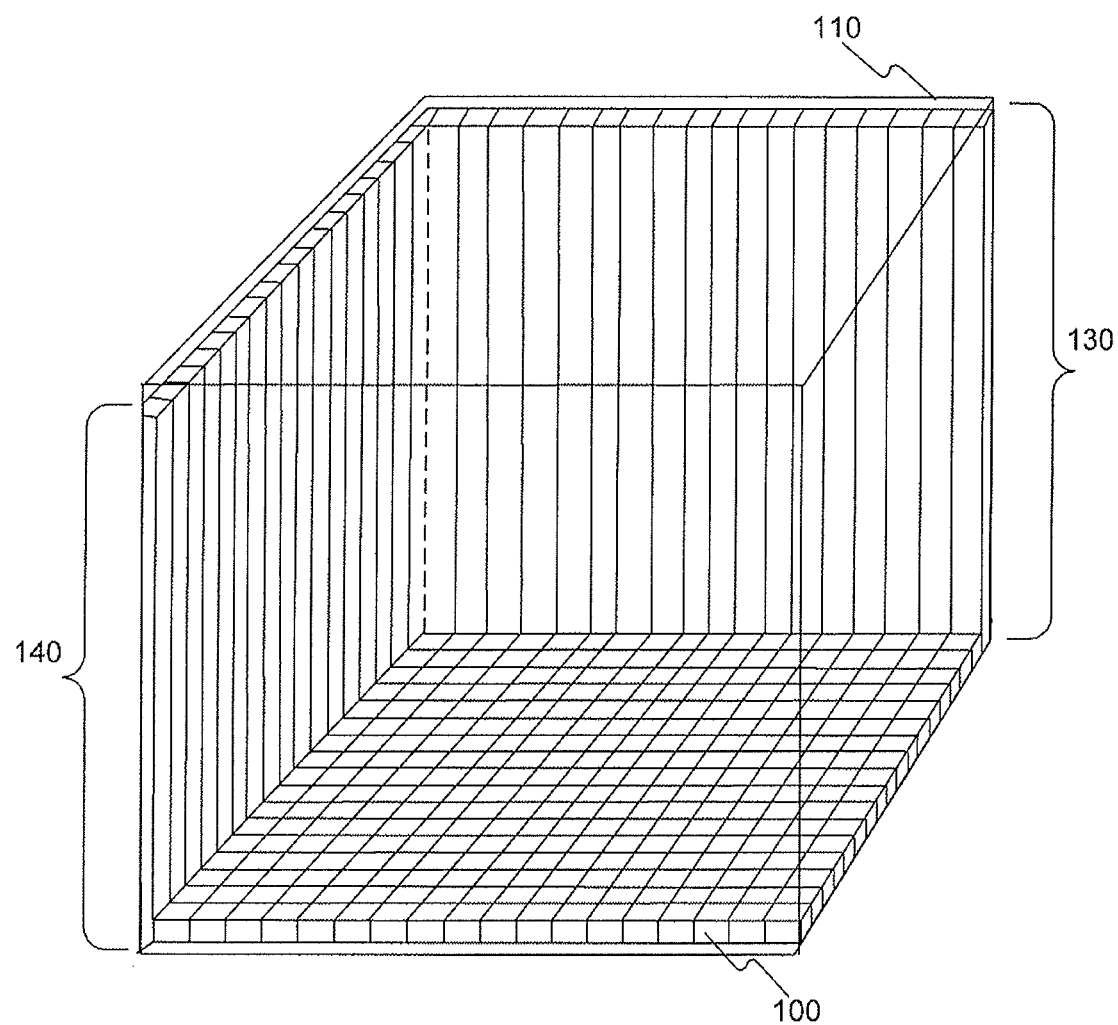
FIG. 2 illustrates another exemplary arrangement of silicon seeds on the bottom and side surfaces of a crucible, according to an embodiment of the present invention.

Referring to FIG. 2, seeds 100 can also be placed on one or more side walls 130, 140 of crucible 110. Seeds 100 can be placed on all four walls of crucible 110, although for illustration purposes only, seeds 100 are shown only on walls 130, 140. Preferably, the seeds 100 that are placed on any of the four walls of crucible 110 are columnar to facilitate crystal growth. Preferably, each of the columnar seeds placed on any of the four walls of crucible 110 will have the same grain orientation as the seed placed immediately below it on the bottom surface of crucible 110. In the case of geometric multi-crystalline silicon growth, placing the columnar seeds in this manner will facilitate the growth of geometric multi-crystalline silicon grains as large as the height of the crucible 110.

Still referring to FIG. 2, advantages of this arrangement of seeds 110 are a quicker, more simple, self-propagating process for casting silicon with higher crystallinity and higher growth rates. For example, silicon may be melted in a silicon 'cup', consisting of many seeds that are stacked together to form a cavity, e.g., a bottom and four walls, inside crucible 110. Alternatively, molten silicon may be poured in a silicon 'cup', consisting of many seeds that are stacked together to form a cavity, e.g., a bottom and four walls, inside crucible 110. In an alternative example, the receiving 'cup' is first brought up to the melting temperature of silicon, but maintained in solid state, and then the molten silicon is poured in and allowed to come to thermal equilibrium. Then, in either example above, crucible 110 is cooled, whereby heat is removed from the bottom and sides of crucible 110 by, for example, a solid heat sink material (not shown) which radiates heat to the ambient, while heat is still applied to the open top of crucible 110. In this way, the resulting cast ingot of silicon may be either monocrystalline or geometric multi-crystalline (depending on the type of seeds 100 used and their orientation), and the crystallization proceeds faster than known multi-crystalline casting processes. To repeat this process, a portion of the sides and bottom of the crystallized silicon ingot are removed, using known techniques, and can be reused in a subsequent casting process. Preferably, a plurality of seed crystals, e.g., seeds 100, are arranged so that a common pole direction among seeds 100 is perpendicular to each of the bottom and a side of crucible 110, so that no grain boundaries are formed between the bottom and a side of crucible 110.

Figure 3A:
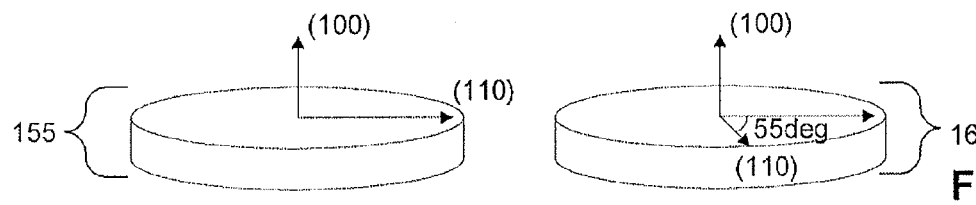
FIG. 3A-3C illustrate an example of tiling for casting geometrically ordered multi-crystalline silicon in a crucible, according to an embodiment of the present invention.
Figure 3B:
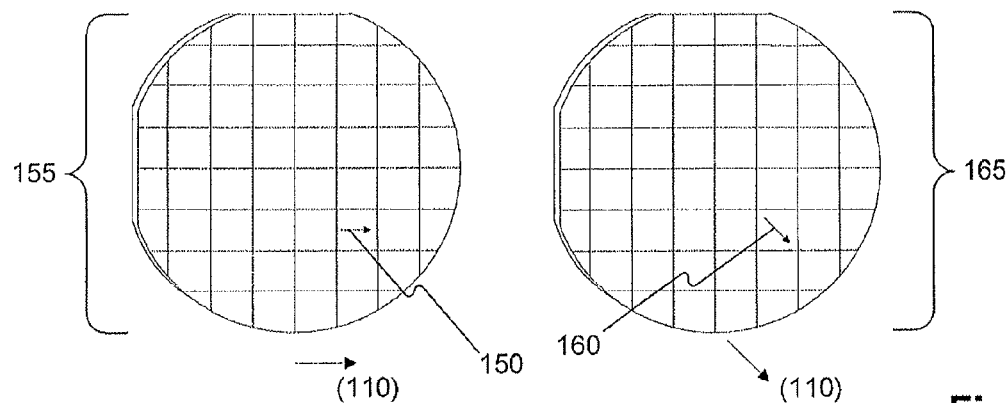
Figure 3C:
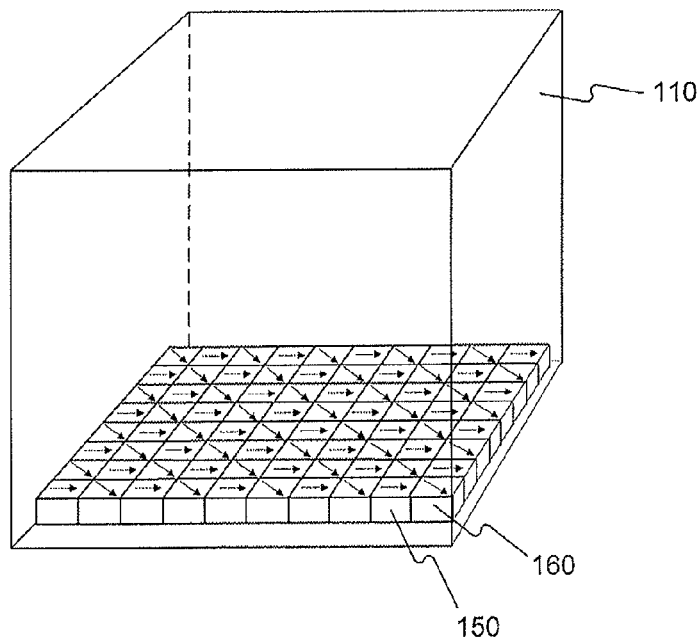

FIGS. 3A-3C illustrate an example of tiling for casting geometric multi-crystalline silicon in crucible 110. Crystal grain engineering can be achieved by careful seed creation, orientation, placement, and crystal growth. FIGS. 3A and 3B, for example, show two monocrystalline silicon slabs 155, 165, on which different (110) directions are indicated. Both slabs have a common (100) direction perpendicular to their surfaces. Each slab of monocrystalline silicon 155, 165, is then cut to form many pieces of silicon, which become seeds 150, 160. The surface types can be uniform, e.g., (100), for texturing reasons, or chosen at will. The shape and size of grains may be selected based on the cutting of the tiles from slabs of monocrystalline silicon 155 and 165, as shown in FIG. 3B. The relative orientation angles between neighboring tiles of pieces 150, 160, determines the grain boundary type (e.g., high angle, low angle or twin) in the resulting cast geometric multi-crystalline silicon. In FIG. 3A, for example, two grain orientations of the (100) pole direction are shown.

The seeds shown in FIG. 3C are then comprised of tiled monocrystalline silicon pieces 150, 160 that have specifically selected orientation relationships with their neighboring tiles. Silicon pieces 150, 160 are then tiled in the bottom of crucible 110, shown in FIG. 3C, such that the two (110) directions are alternating, as shown by the arrows drawn on pieces 150, 160. It is important to note that pieces 150, 160 are drawn as roughly square blocks for illustrative purposes only, and for the reasons discussed below, could be other shapes.

Although not shown in FIG. 3C, seeds may also be located on the sides of crucible, as in FIG. 2. Silicon feedstock (not shown) may then be introduced into crucible 110 over pieces 150, 160, and then melted. Alternatively, molten silicon may be poured in crucible 110. In the alternative example, crucible 110 is first brought very close to or up to the melting temperature of silicon, and then the molten silicon is poured in. Consistent with embodiments of the invention, a thin layer of the seeds can be melted before solidification begins.

Then, in either example above, crucible 110 is cooled, whereby heat is removed from the bottom of crucible 110 (and sides only if seeds are tiled on the side surfaces as well) by, for example, a solid heat sink material which radiates heat to the ambient, while heat is still applied to the open top of crucible 110. Thus, melted silicon is introduced while the seed is maintained as a solid, and directional solidification of the melt causes the upwards growth of the columnar grains. In this way, the resulting cast ingot of geometric multi-crystalline silicon will mimic the grain orientations of tiled silicon seeds 150, 160. Once this technique is properly implemented, the resulting ingot can be cut into, for example, horizontal slabs to act as seed layers for other casting processes. The slab can have, for example, the size and shape, or substantially the size and shape, of a surface, such as a bottom, of a crucible or other vessel used for the casting. For example, only one such slab can be used for a casting process.

Figure 4:
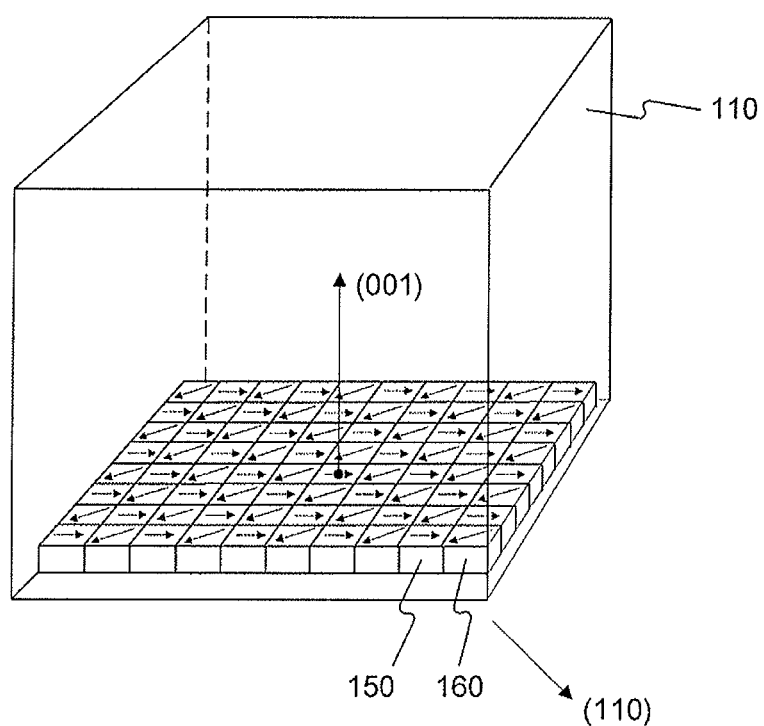
FIG. 4 illustrates another example of tiling for casting geometrically ordered multi-crystalline silicon in a crucible, according to an embodiment of the present invention.

FIG. 4 illustrates a variation of the tiling shown in FIG. 3C. As an example of grain orientation for cast geometric multi-crystalline silicon, seed pieces 150, 160 are tiled with a common pole direction (001) being perpendicular to the bottom of crucible 110. In FIG. 4, all variations of the (110) family of directions are represented in the tiling of pieces 150, 160, as indicated by the directional arrows. Although not shown in this particular figure, seeds can also be on one or more sides of crucible 110.

Thus, the orientation of seed crystals in a crucible used to form the silicon may be chosen such that specific grain boundaries are formed in cast geometric multi-crystalline silicon, and where such grain boundaries enclose geometric shapes. In contrast to embodiments of the invention, known casting processes involve the casting of multi-crystalline grains in an uncontrolled fashion by directional solidification from a completely melted mass of silicon. The resulting grains have basically random orientation and size distribution. The random grain orientation makes it difficult to effectively texture the silicon surface. Furthermore, it has been shown that kinks in the grain boundaries, natural products of the typical growth techniques, tend to nucleate structural defects involving clusters or lines of dislocations. These dislocations, and the impurities that they tend to attract, cause fast recombination of electrical carriers and the degradation of performance as a photovoltaic material. Therefore, consistent with an embodiment of the invention, careful planning and seeding of a regular grain boundary network for casting of either monocrystalline or geometric multi-crystalline silicon is accomplished such that the size, shape and orientation of grains is explicitly chosen to maximize minority carrier lifetime and impurity gettering while minimizing structural defects.

Grain boundaries can be chosen to be flat planes in order to minimize dislocation nucleation while maintaining their vertical direction during growth. The grain boundary types are chosen to maximize gettering of impurities and stress relief. The grain orientations (and especially the surface orientation) are chosen to allow texturing, improve surface passivation and enhance grain strength. The size of the grains is chosen to optimize the balance between effective gettering distances and large absorption areas. For example, casting of geometric multi-crystalline silicon can be accomplished such that the geometric multi-crystalline silicon has an average minimum grain cross-section size of at least about 0.5 cm to about 10 cm with a common pole direction being perpendicular to the surface of the cast geometric multi-crystalline silicon, as shown, for example, in FIGS. 3C and 4. The average crystal grain cross-section size can be about 0.5 cm to about 70 cm, or larger. As described above, the cross-section size is understood as the longest dimension of the cross-section of the grain that is perpendicular to the height or length of the grain. The net result is an overall increase in efficiency of the resulting photovoltaic material.

Figure 5:
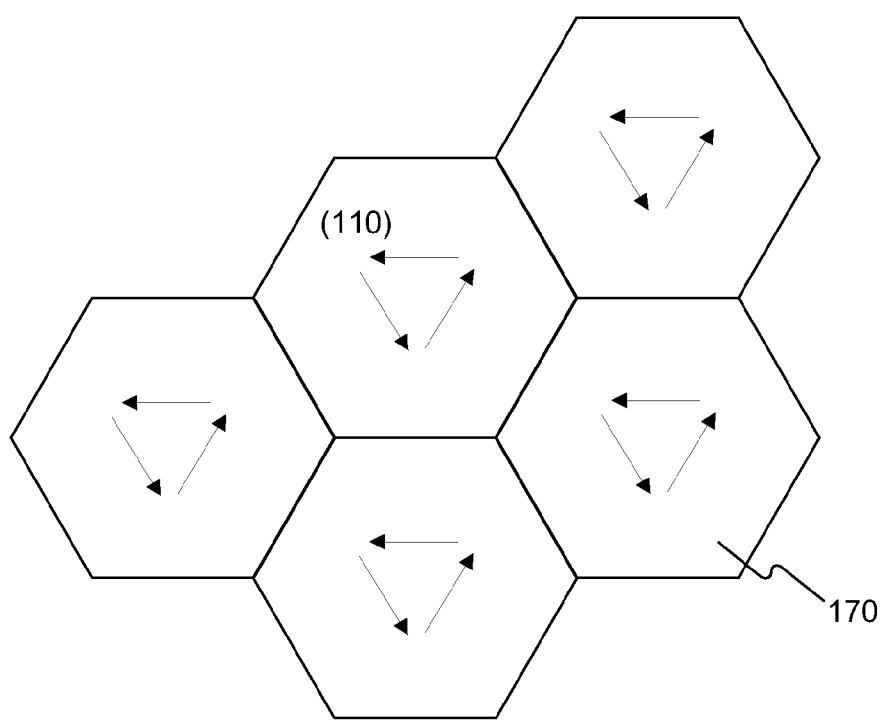
FIG. 5 illustrates an example of a close-packed array of hexagon seed tiles, according to an embodiment of the present invention.
Figure 6:
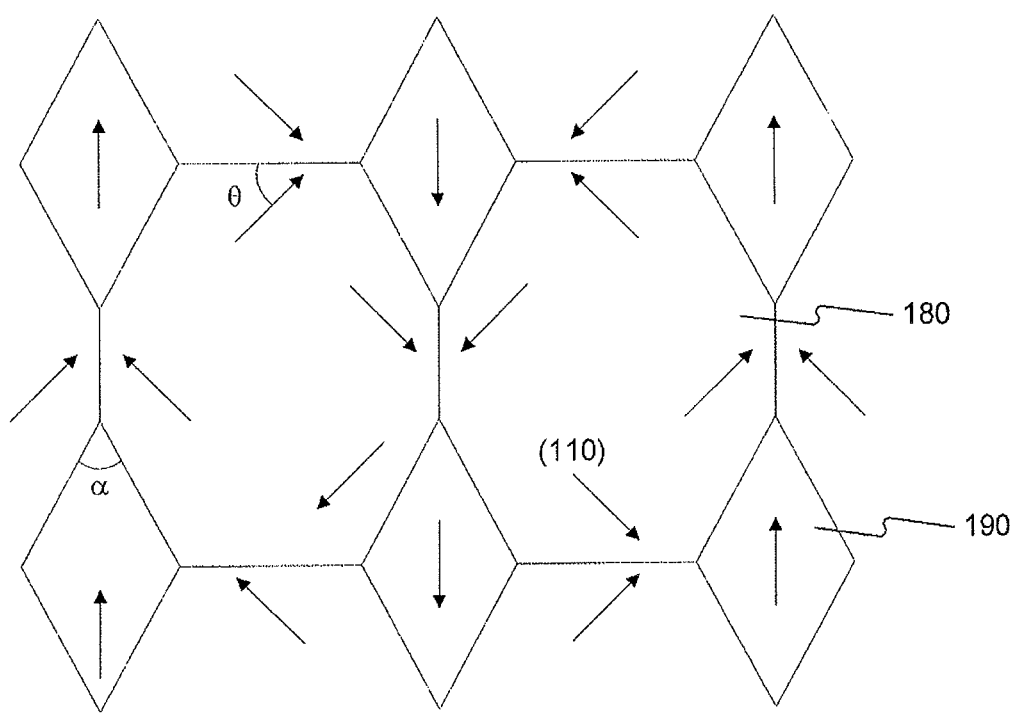
FIG. 6 illustrates an exemplary array of polygonal shapes having rhomboid or triangular interstices, according to an embodiment of the present invention

Consistent with an embodiment of the invention, a geometric arrangement of a plurality of monocrystalline silicon seed crystals can be placed on at least one surface in a crucible, e.g., a bottom surface of a crucible, wherein the geometric arrangement includes close-packed polygons. Alternatively, a geometric arrangement of a plurality of monocrystalline silicon seed crystals can be placed such that the geometric arrangement includes close-packed hexagons, or polygonal shapes having rhomboid or triangular interstices, as shown, for example, in FIGS. 5 and 6. In yet another alternative, instead of using a plurality of monocrystalline seed crystals, a section or slab of silicon cut or otherwise obtained from an ingot produced in a prior casting of monocrystalline silicon or near-monocrystalline silicon can be used as a single seed crystal for casting monocrystalline silicon or near-monocrystalline silicon in accordance with this invention. Such a single seed crystal can be the same size and shape, or substantially the same size and shape, as a surface of the crucible or other vessel used to conduct the casting. More specifically, FIG. 5 illustrates an example of a close-packed array of hexagons 170. In contrast, FIG. 6 illustrates an example of an array of polygonal shapes having rhomboid or triangular interstices 180, 190. Both arrays are discussed in more detail below. Any of the arrangements discussed above are also applicable to an embodiment for casting either a solid body of monocrystalline silicon, a solid body of near-monocrystalline silicon, or a solid body of geometric multi-crystalline silicon, where the seed crystals are so placed on both the bottom and side surfaces of a crucible.

The silicon crystal grains produced by casting a body of geometric multi-crystalline silicon, consistent with embodiments of the invention, may be grown in a columnar manner. Further, such crystal grains may have a cross section that is, or is close to, the shape of the seed from which it is formed. When making silicon that has such specifically selected grain boundaries, preferably the grain boundary junctions only have three grain boundaries meeting at a corner. As shown in FIG. 5, hexagonal arrangements of seed crystals 170 are desirable for the tiling of seeds where the crystal orientation is such that the atoms in the horizontal plane have three-fold or six-fold symmetry, such as (111) for silicon. Thus, FIG. 5 illustrates a plan view of a portion of a collection of hexagonal-shaped seeds for arrangement in the bottom of a suitable crucible, such as that shown in FIGS. 1 and 2. The arrows indicate the orientation of the (110) direction of the silicon crystal in the seeds.

Alternatively, for orientations with 4-fold symmetry, a different geometric configuration of the seeds can be used to maintain stable, symmetric grain boundaries across multiple grains while still meeting the three grain boundary corner rule. For example, if $\theta$ is the misorientation between the (110) direction and the primary sides of an octagon with a (100) pole, and $\alpha$ is the apex angle of an interstitial rhombus, as shown in FIG. 6, all crystal grains will have a symmetric grain boundary with respect to the (110) direction if $\alpha=90°-\theta$. In this example, all crystal grains have a (100) pole direction perpendicular to the plane of the paper on which FIG. 6 is depicted. Thus, FIG. 6 is a plan view of a portion of a collection of octagonal-shaped seeds along with rhombus-shaped seeds 180, 190 for arrangement in the bottom of a suitable crucible, such as that shown in FIGS. 1 and 2. The arrows indicate the orientation of the (110) direction of the silicon crystal in the seeds.

Figure 7:
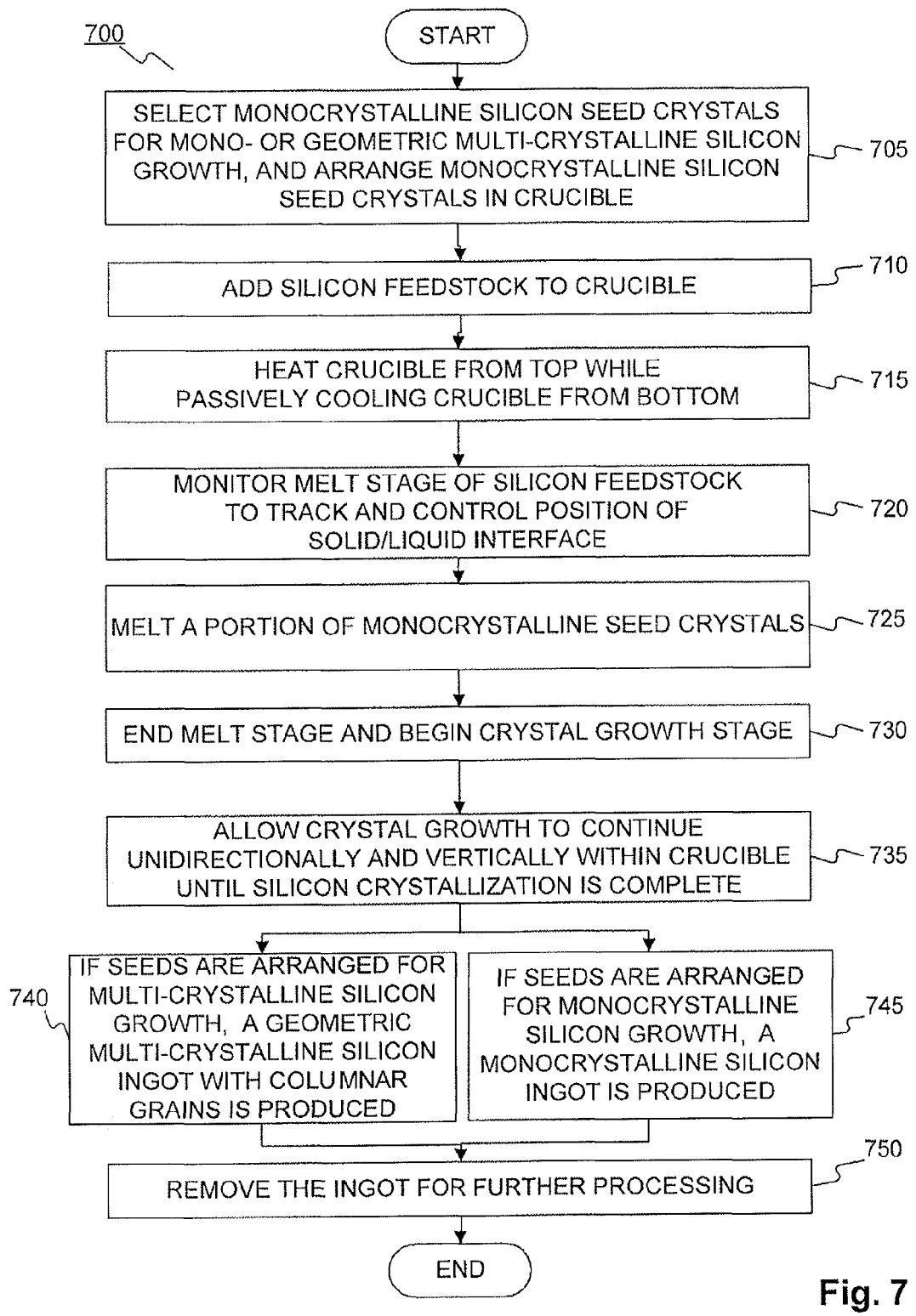
FIG. 7 illustrates an exemplary method, according to an embodiment of the present invention.

FIG. 7 is a flowchart depicting an exemplary method of making silicon, consistent with the present invention. Consistent with FIG. 7, method 700 may begin by selecting monocrystalline silicon seed crystals for monocrystalline or geometric multi-crystalline silicon growth, and arranging the monocrystalline silicon seed crystals in a crucible (step 705). Alternatively, a single slab cut or otherwise obtained from an ingot of monocrystalline silicon or geometrically ordered multi-crystalline silicon can be used as a single seed crystal. Next, silicon feedstock may be added to the crucible (step 710). The crucible is then heated from the top while the bottom of the crucible is cooled from the bottom (either passively or actively; see step 715). During melting, the melt stage of the silicon is monitored to track and control the position of the solid-liquid interface (step 720). The melt stage of the silicon is allowed to proceed until a portion of the monocrystalline silicon seed crystals are melted (step 725). Once a desired portion of the monocrystalline silicon seed crystals are melted, the melt stage is ended and the crystal growth stage begins (step 730). The crystal growth is allowed to continue unidirectionally and vertically within the crucible until the silicon crystallization is complete (step 735). If the seeds are arranged for geometric multi-crystalline silicon growth, the crystallization of step 735 will produce a geometric multi-crystalline silicon ingot with columnar grains (step 740). Alternatively, if the seeds are arranged for monocrystalline silicon growth, the crystallization of step 735 will produce a monocrystalline silicon ingot (step 745). Finally, the ingot produced in either step 740 or 745 is removed for further processing (step 750).

Figure 8A:
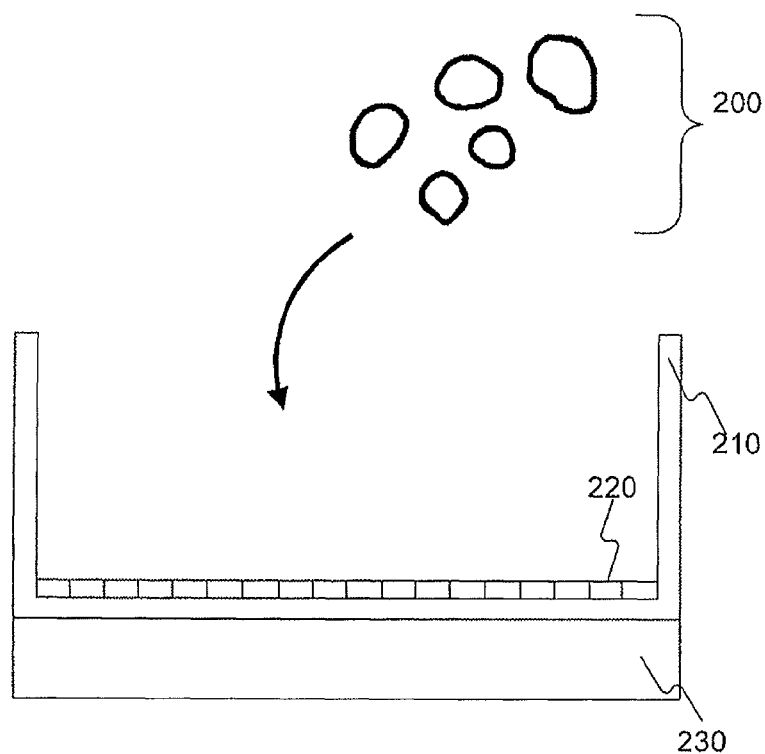
FIGS. 8A-8G and 9 illustrate exemplary casting processes for monocrystalline or geometrically ordered multi-crystalline silicon, according to embodiments of the present invention.

As shown in FIG. 8A, silicon feedstock 200 may be introduced to crucible 210 containing seeds 220 in, for example, one of two ways. In the first, crucible 210 is loaded to full capacity with solid silicon feedstock 200, suitably in the form of conveniently sized chunks, and the loaded crucible 210 is placed in a casting station (not shown).

Figure 8B:
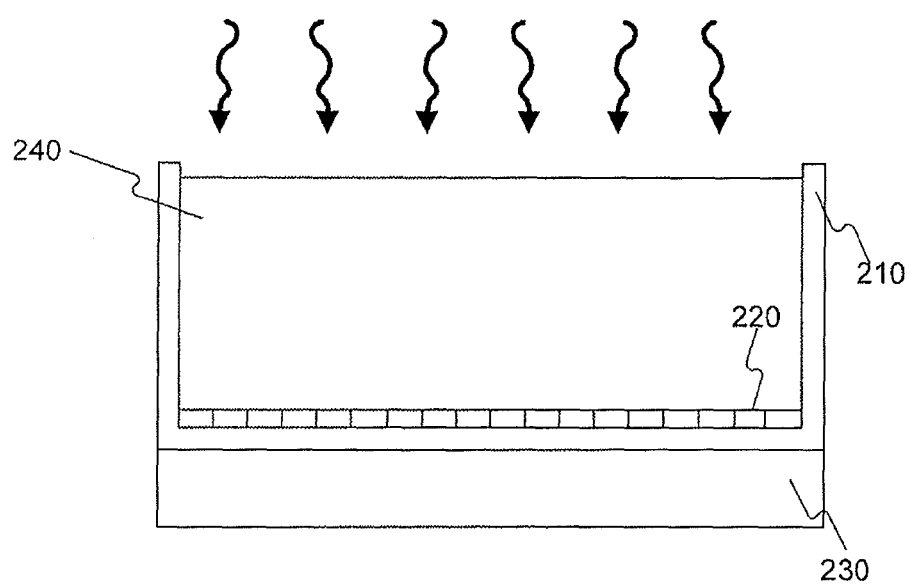

As shown in FIG. 8B, the thermal profile in crucible 210 is set up so that the top of the silicon charge in crucible 110 is heated to melting, while the bottom is actively or passively cooled to maintain the solid phase of seeds 220 at the bottom of crucible 210, i.e., so that they do not float when feedstock 200 is melted. A solid heat sink material 230 is in contact with a bottom of crucible 210 for radiating heat to water-cooled walls. For example, heat sink material 230 can be a solid block of graphite, and can preferably have dimensions as large or larger than the bottom of the crucible. Consistent with the invention, for example, the heat sink material can be 66 cm by 66 cm by 20 cm, when used with a crucible having a bottom surface that is 66 cm by 66 cm. The side walls of crucible 210 are, preferably, not cooled in any way, provided that seeds 220 are located only on the bottom of crucible 210. If seeds 220 are located on the bottom and sides of crucible 210, then heat sink material 230 would be placed on both the bottom and sides of crucible 210 for maintaining the desired thermal profile.

The melting phase of silicon feedstock 200 is closely monitored to track the position of the interface between the melted silicon and the seeds. Preferably, melt 240 (shown in FIG. 8B) proceeds until all of the feedstock silicon 200 except for seeds 220 is completely melted, after which seeds 220 are partially melted. For example, the heating can be closely controlled such that the seeds 220 do not melt completely, by maintaining a $\Delta T$ of about 0.1° C./min or less, as measured on an outside surface of the crucible, after reaching the melting temperature of silicon elsewhere in the crucible. Preferably, the heating can be closely controlled by maintaining a $\Delta T$ of about 0.05° C./min or less, as measured on an outside surface of the crucible, after reaching the melting temperature of silicon elsewhere in the crucible. For example, consistent with the invention, the $\Delta T$ can be measured on an outside surface of the crucible between the crucible and a large block of graphite, and a dip-rod may be inserted into melt 240 to measure the depth of the melt, in order to calculate the portion of seeds 220 that have melted.

Figure 8C:
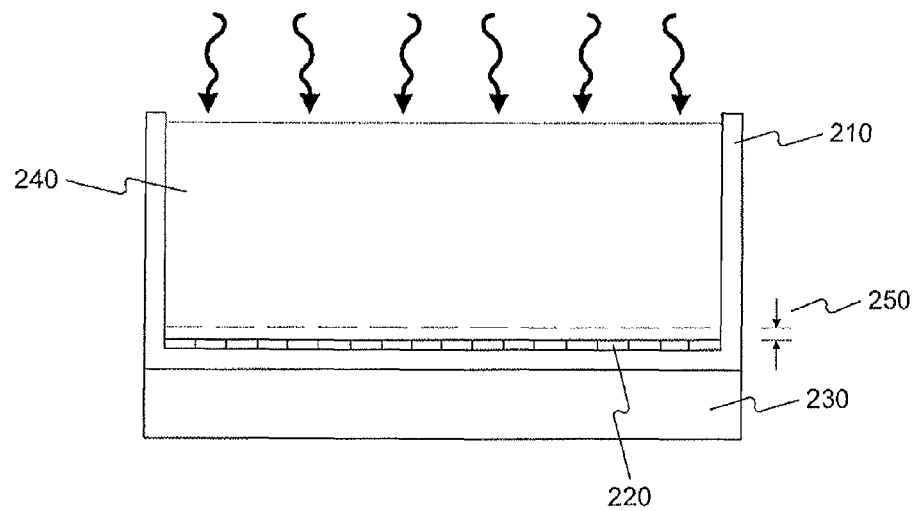
Figure 8D:
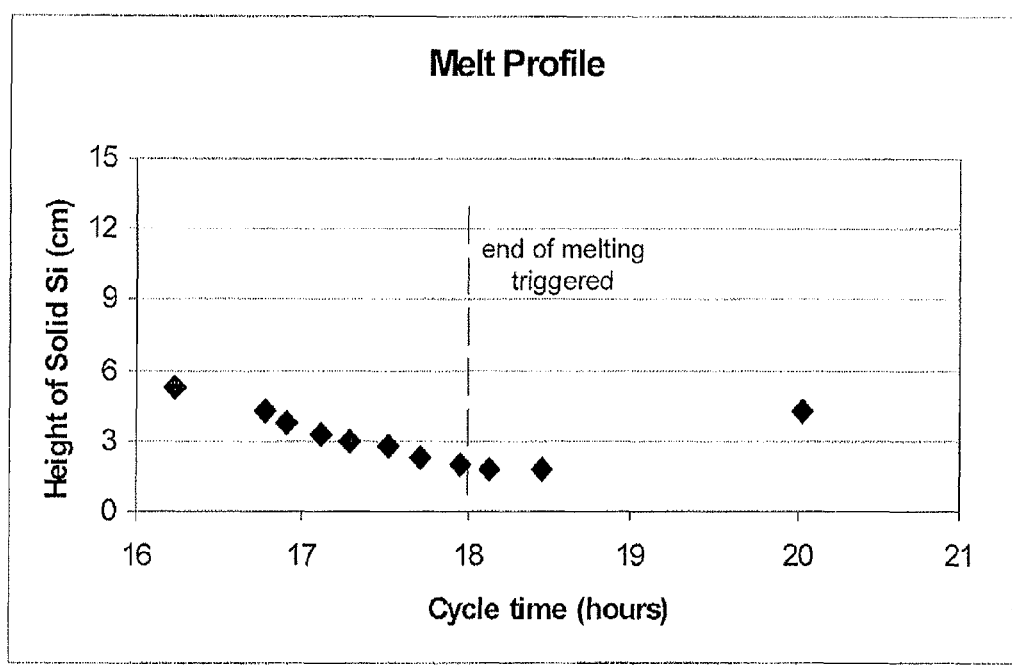

As shown in FIG. 8C, portion 250 illustrates a melted portion of the total thickness of seeds 220, below the melt 240. After a portion 250 of seeds 220 are melted below melt 240, the melt stage is then quickly ended and the crystal growth stage is begun, wherein the heating at the top of crucible 210 is decreased and/or the cooling of the bottom at heat sink material 230 is increased. As an example of this process, the chart shown in FIG. 8D illustrates melting of a portion 250 of seeds 220 as a function of time. As shown in FIG. 8D, a portion of the seeds having an initial thickness between 5 and 6 cm are gradually melted until just under 2 cm of solid seed remains. For example, the heating can be closely controlled such that the seeds 220 do not melt completely, by maintaining a $\Delta T$ of about 0.1° C./min or less, as measured on an outside surface of the crucible (e.g., through a thermocouple mounted in the cooling block), after reaching the melting temperature of silicon elsewhere in the crucible. Preferably, the heating can be closely controlled by maintaining a $\Delta T$ of about 0.05° C./min or less, as measured on an outside surface of the crucible, after reaching the melting temperature of silicon elsewhere in the crucible. At this point, the melt stage is then quickly ended and the crystal growth stage is begun, which is indicated by the comparative rise in solid thickness measured on the ordinate of the chart.

Figure 8E:
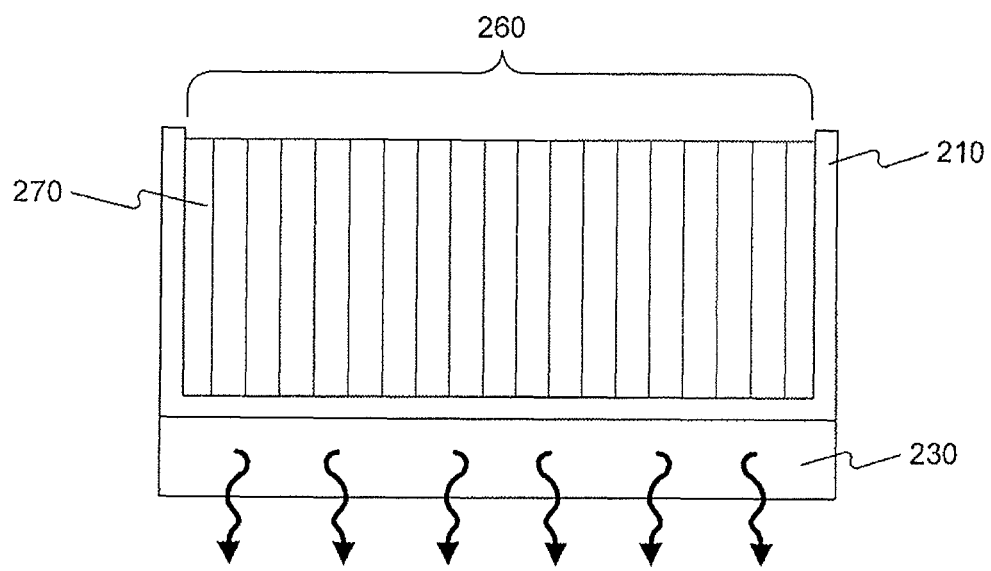

Then, as shown in FIG. 8E, seeded crystal growth continues unidirectionally, and vertically, within crucible 210 until the silicon crystallization is complete. The casting cycle finishes when the top-to-bottom thermal gradient within crucible 210 is evened out. Then, the entire ingot 260 is slowly cooled down to room temperature. For casting of geometric multi-crystalline silicon, as shown in FIG. 8E, this seeded unidirectional growth produces columnar shaped grains 270 having, generally, a horizontal cross section that is the shape of the individual seed 220 over which it is formed. In this manner, the grain boundaries of the cast geometric multi-crystalline silicon can be pre-selected. Any of the previously discussed seeding patterns/tiling are applicable to this casting process.

Figure 8F:
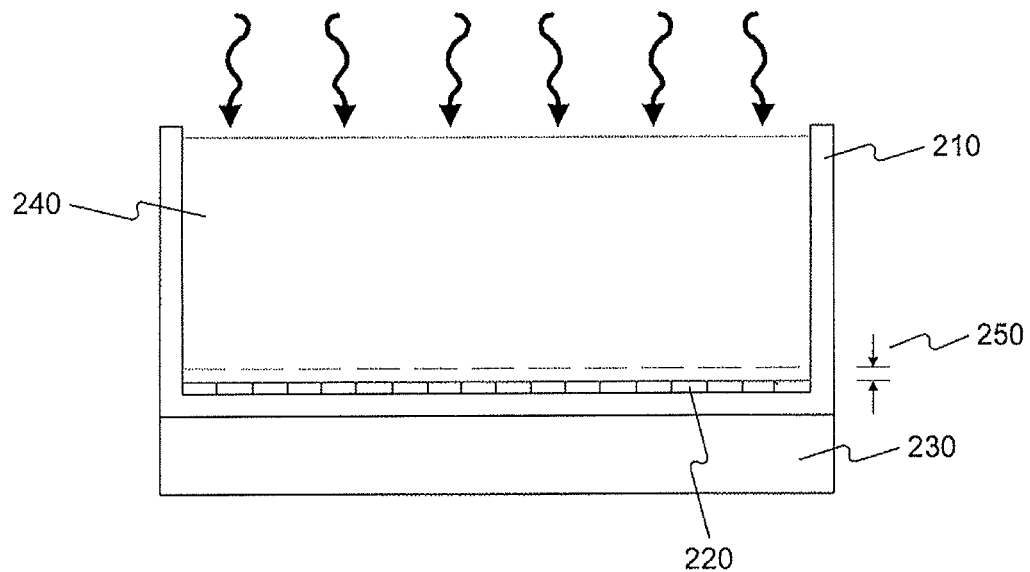
Figure 8G:
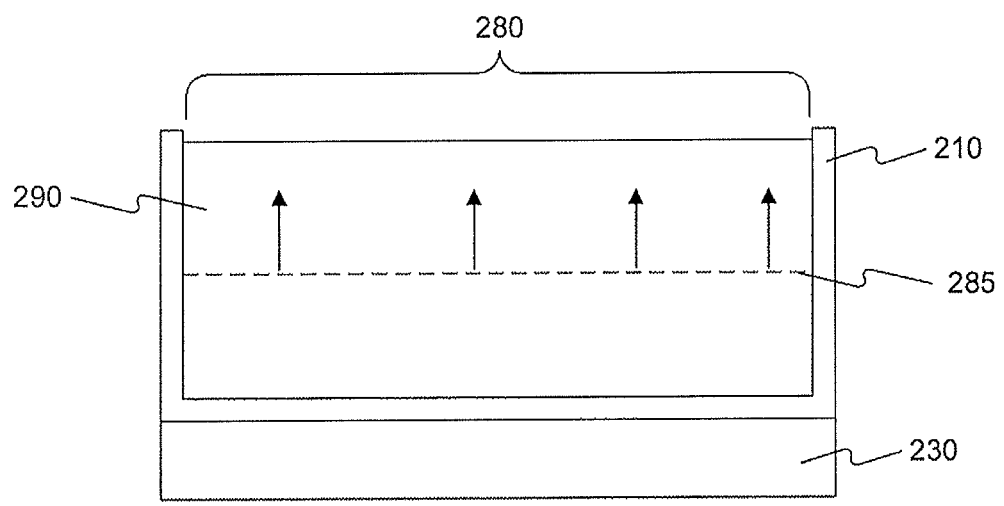

Alternatively, for casting of monocrystalline silicon, the arrangement of seeds 220 can be made to have no grain boundaries at all, resulting in cast monocrystalline silicon. As shown in FIG. 8F, portion 250 illustrates a melted portion of the total thickness of seeds 220, below the melt 240. After a portion 250 of seeds 220 are melted below melt 240, the melt stage is then quickly ended and the crystal growth stage is begun, wherein the heating at the top of crucible 210 is decreased and/or the cooling of the bottom at heat sink material 230 is increased. Then, as shown in FIG. 8G, seeded crystal growth continues unidirectionally, and vertically, within crucible 210 until the silicon crystallization is complete. A preferably substantially flat solid-liquid interface 285 propagates upward and away from a bottom surface of crucible 210. The casting cycle finishes after the completion of crystal growth, when the top-to-bottom thermal gradient within crucible 210 is evened out. Then, the entire ingot 280 is slowly cooled down to room temperature. For casting of monocrystalline silicon, as shown in FIG. 8G, this seeded unidirectional growth produces a continuous solid body of cast monocrystalline silicon 290.

Figure 9:
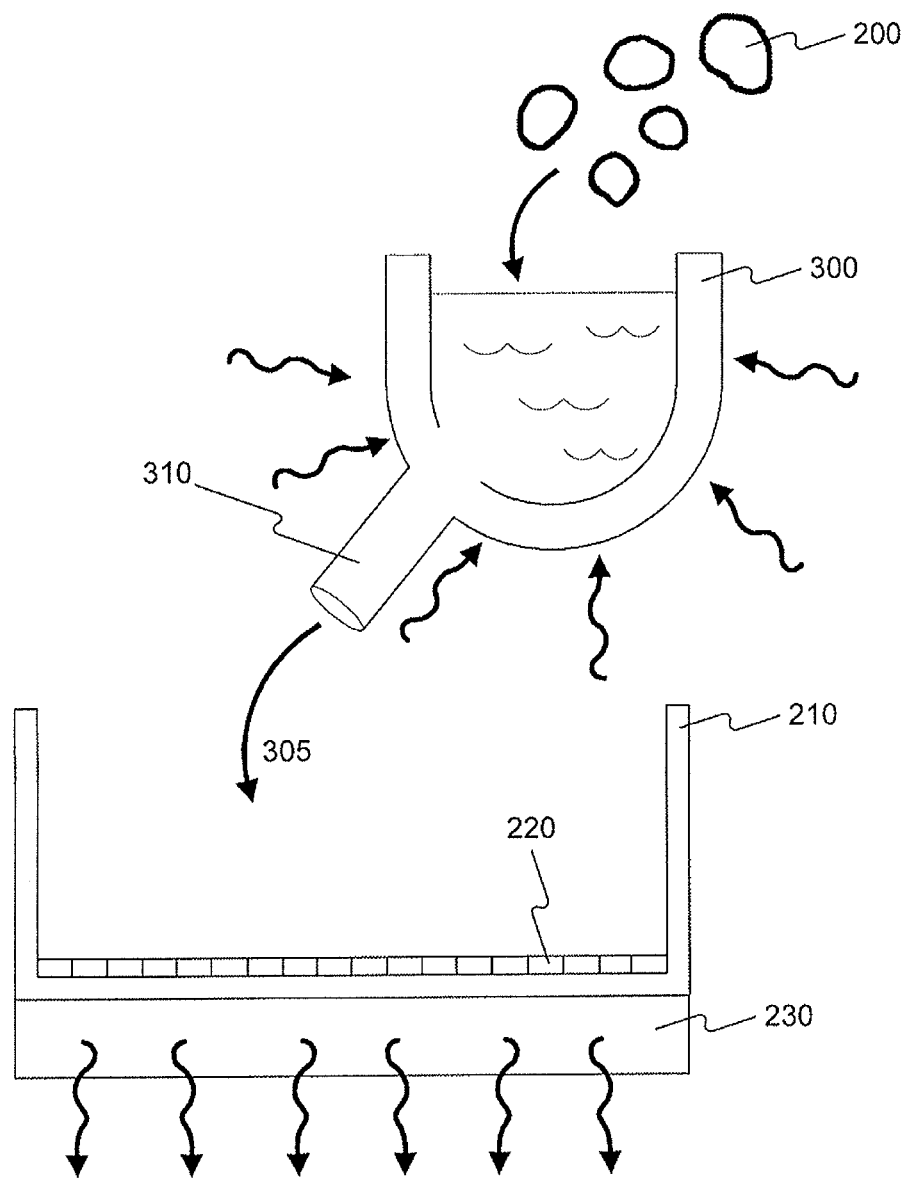

In another process, illustrated in FIG. 9, silicon feedstock 200 may be first melted in a separate compartment or separate melt vessel 300. Seeds 220 may or may not be partially melted from the top before the molten feedstock 305 is fed or poured into crucible 210 via melt pipe 310, after which cooling and growth proceeds as described with reference to FIGS. 8B-8G. In another embodiment, silicon seed crystals may be mounted on the walls of crucible 210 (not shown) and seeded growth can proceed from the sides as well as the bottom of crucible 210, as described previously. Alternatively, silicon feedstock 200 is melted in a melt vessel 300 separate from crucible 210, and at the same time crucible 210 is heated to the melting temperature of silicon, and the heating is controlled so that seeds 220 do not melt completely. Upon partial melting of seeds 220, molten feedstock 305 can be transferred from melt vessel 300 into crucible 210, and the cooling and crystallization can begin. Thus, consistent with an embodiment of the invention, a portion of the solid body of crystallized silicon can include seeds 220. Alternatively, the seeds may be kept completely solid prior to melt introduction. In this case, the molten silicon in melt vessel 300 is heated beyond the melting temperature, and the superheated liquid is allowed to melt a portion of some of the seeds when the superheated liquid is introduced.

In a two-stage casting station, such as that shown in FIG. 9, molten feedstock 305 would pour down from melt vessel 300, land on seeds 220, and assume their crystallinity during solidification. Alternatively, melting may take place in a central melt vessel 300, which feeds a distributed arrangement of solidification crucibles, such as one or more copies of crucible 210 (not shown). Consistent with embodiments of the invention, the solidification crucibles can be lined with seeds 220 on either or both of the sides and bottom of the crucibles. Some advantages of this approach include: the separation of melting and solidification systems, to allow better optimization of each casting step; a semi-continuous melting of silicon, where melting of new material can occur in a regular fashion, as needed to maintain the crucible supply; slagging of the top (and potential draining of the bottom) silicon while the solidification stations are fed from the middle of the melt, enhancing purity of the starting silicon material; and allowing melt vessel 300 to come into equilibrium with molten feedstock 305 and no longer be a significant source of impurities.

Thus, after an ingot 260 or 280 has been cast by one of the methods described above, the resulting cast ingot can be processed further by, for example, cutting off the bottom or another section of the ingot and using it as a single crystal seed in a subsequent casting run to form a body of monocrystalline silicon, near-monocrystalline silicon, or geometric multi-crystalline silicon, consistent with the invention, and wherein the size and shape of such single crystal seed is the same size and shape of the bottom of crucible used in the subsequent casting run, and the rest of the ingot can be cut into bricks and wafers for processing into photovoltaic cells. Alternately, the entire ingot can be cut into, for example, horizontal slabs for use as seed crystals in multiple casting stations for future casting runs.

The silicon feedstock used in processes consistent with embodiments of the invention can contain one or more dopants such as those selected from a list including: boron, aluminum, lithium, gallium, phosphorus, antimony, arsenic, and bismuth. The total amount of such dopant can be about 0.01 parts per million by atomic % (ppma) to about 2 ppma. Preferably, the amount of dopant in the silicon is an amount such that a wafer made from the silicon has a resistivity of about 0.1 to about 50 ohm-cm, preferably of about 0.5 to about 5.0 ohm-cm.

Thus, consistent with the present invention, the silicon can be a body of cast continuous monocrystalline silicon, cast near-monocrystalline silicon, or cast continuous geometric multi-crystalline silicon, that preferably is essentially free of, or free of, radially distributed defects such as OSF's and/or swirl defects, and, preferably, where at least two dimensions of the body are preferably at least about 10 cm, preferably at least about 20 cm, more preferably at least 30 cm, still more preferably at least 40 cm, still more preferably at least 50 cm, still more preferably at least 60 cm, and most preferably at least about 70 cm. Most preferably, the third dimension of such a body of silicon is at least about 5 cm, preferably at least about 15 cm and most preferably at least about 20 cm. The body of silicon can be one separate piece as a single body, or it can be contained within or surrounded by, totally or partially, other silicon. The body of silicon can be formed preferably having at least two dimensions each being as large as the interior dimensions of a casting vessel. As disclosed herein, embodiments of the invention can be used to produce large bodies of monocrystalline silicon, near-monocrystalline silicon, or geometric multi-crystalline silicon by a simple and cost-effective casting process.

The following are examples of experimental results consistent with embodiments of the invention. These examples are presented for merely exemplifying and illustrating embodiments of the invention and should not be construed as limiting the scope of the invention in any manner.

EXAMPLE 1

Seed preparation: A boule of pure Czochralski (CZ) silicon (monocrystalline), obtained from MEMC, Inc. and having 0.3 ppma of boron, was cut down along its length using a diamond coated band saw so that it had a square cross section measuring from 14 cm per side. The resulting block of monocrystalline silicon was cut through its cross section using the same saw into slabs having a thickness of about 2 cm to about 3 cm. These slabs were used as monocrystalline silicon seed crystals, or "seeds." The (100) crystallographic pole orientation of the silicon boule was maintained. The resulting single crystal silicon slabs were then arranged in the bottom of a quartz crucible so that the (100) direction of the slabs faced up, and the (110) direction was kept parallel to one side of the crucible. The quartz crucible had a square cross section with 68 cm on a side, a depth of about 40 cm, and a wall thickness of about 1.8 cm. The slabs were arranged in the bottom of the crucible with their long dimension parallel to the bottom of the crucible and their sides touching to form a single, complete layer of such slabs on the bottom of the crucible.

Casting: The crucible then was filled up to a total mass of 265 kg of solid silicon feedstock at room temperature. The filled crucible was then loaded into an in-situ melting/directional solidification casting station used to cast multi-crystalline silicon. The melt process was run by heating resistive heaters to approximately 1550° C., and the heaters were configured so that the heating came from the top while heat was allowed to radiate out the bottom by opening the insulation a total of 6 cm. This configuration caused the melting to proceed in a top-down direction towards the bottom of the crucible. The passive cooling through the bottom caused the seed crystals to be maintained in solid state at the melting temperature, as was monitored by a thermocouple. The extent of melting was measured by a quartz dip rod that was lowered into the melt every ten minutes. The dip rod height was compared with a measurement taken on an empty crucible in the station to determine the height of the remaining solid material. By dip rod measurement, first the feedstock melted, and then the melting phase was allowed to continue until only a height of about 1.5 cm of the seed crystals remained. At this point, the heating power was dropped to a temperature setting of 1500° C., while the radiation from the bottom was increased by opening the insulation to 12 cm. One or two additional millimeters of seed crystals melted before solidification began, as observed by dip-rod measurements. Then seeded single crystal growth proceeded until the end of the solidification step. The growth stage and the remainder of the casting cycle was performed with the normal parameters where the top-to-bottom thermal gradient was evened out, and then the entire ingot was slowly cooled to room temperature. The cast silicon product was a 66 cm by 66 cm by 24 cm ingot, of which a central portion having a horizontal square cross section measuring 50 cm by 50 cm was monocrystalline silicon from top to bottom. The monocrystalline silicon structure was evident from visually inspecting the surface of the ingot. Additionally, etching of the silicon with a caustic formula capable of delineating grain boundaries further affirmed the lack of grain boundaries in the material. The bulk doping average was 1.2 ohm-cm, and the photovoltaic cells manufactured from this silicon had an electrical efficiency of 16.0%.

In other casting runs conducted in accordance with this example, it was observed that the cast silicon product was a contiguously consistent crystal of silicon that contained smaller crystals of silicon of other crystal orientations, or was a body of monocrystalline silicon that had adjacent regions of multi-crystalline silicon.

EXAMPLE 2

Seed preparation: Seeding was accomplished as in Example 1, except that the monocrystalline silicon seeds were cut so that the (110) direction was at 45 degrees from the side of the square seeds for half of the seeds, while the other half had an angle of approximately 20 degrees. The square pieces were layered in the bottom of the crucible in a checkerboard manner alternating the two different seed orientations, i.e., the (110) direction had an angle of 45 degrees and 20 degrees from the orientation of the crucible sides. Relative to one another, the seeds had either 25 degrees or 155 degrees of misorientation. However, due to size mismatches of the square-shaped seeds, some gaps in the seeding layer were left uncovered. The crucible measured approximately 33 cm on each of the square sides and approximately 22 cm tall.

Casting: The crucible containing the seeds and a separate crucible containing a total of 56 kg of feedstock silicon chunks were loaded into a Ubiquitous Casting Process (UCP) two-stage casting station. The receiving crucible (with the seeds inside) was heated up to the melting point of silicon, but not given the energy to melt completely. The silicon in the other crucible was melted by resistive graphite heaters at a temperature at least 50° C. above the melting temperature of silicon, and then poured into the receiving crucible. At this point, solidification began immediately, with the heat being extracted from the bottom of the receiving crucible in order to effect directional solidification and seeded crystal growth. The standard growth cycle was shortened to account for the mass of already solidified material that the seeds constituted. In this way, instead of allowing time for all 66 kg (10 kg of seeds and 56 kg of feedstock silicon) to solidify before the cool down process began, only time for the 56 kg of molten silicon was provided to avoid waste of heating energy. The product of this process was an ingot of silicon with large, generally columnar grains having a square cross section having shape and dimensions that remained close to the top surface of the original seed crystal dimensions over which they were formed. The lateral grain boundary positions drifted in some cases as the growth proceeded.

EXAMPLE 3

Seed preparation: Seeding was accomplished with 23 kg of square, (100), plates used to line the bottom of a crucible, providing a coverage area of 63 cm×63 cm and a thickness ranging from 3 cm in the center to 1.8 cm at the sides. All plates were arranged with their (110) directions at 45° from the walls of the crucible.

Casting: The crucible containing the seeds was filled with an additional total of 242 kg of feedstock silicon chunks, representing a mix of intrinsic silicon, silicon recycled from previous ingots, and double-cast silicon with a p-type resistivity greater than 9 ohm-cm. The charge of silicon in the crucible was loaded into a one-stage directional solidification furnace. The crucible (with the seeds inside) was heated up to a temperature of 1550° C., while the bottom was cooled by opening the insulation to 12 cm. The solid-liquid interface remained substantially flat during melting, such that at the end of melting, no part of the seed was melted through. The thickness of the silicon was monitored by use of a quartz dip rod. When a center thickness was measured at 2.5 cm, the melt stage was stopped, the heater temperature dropped to 1440° C. and the insulation height was increased to 15 cm. From the beginning of the melt phase change, the rate of temperature increase was maintained at or below 0.1° C./min, as measured on an outside surface of the crucible, after reaching the melting temperature of silicon elsewhere in the crucible. Then, the remainder of the solidification process was allowed to proceed, with roughly constant power to the heater being maintained until the end of crystal growth was observed. After the end of growth, the temperature of the crystallized silicon ingot was evened out and then brought uniformly down to room temperature. After removing the ingot from the crucible, the bottom of the ingot was cut off in one large piece for later re-use as a seed in another subsequent casting process, and the remainder of the ingot was cut into 12.5 cm square bricks for further processing. The process was successful in begetting monocrystalline growth substantially over the entire seed layer cross-section, and proceeded through to the top of the ingot. Monocrystallinity was evident from inspection of the cut silicon.

In other casting runs conducted in accordance with this example, it was observed that the cast silicon product was a contiguously consistent crystal of silicon that contained smaller crystals of silicon of other crystal orientations, or was a body of monocrystalline silicon that had adjacent regions of multi-crystalline silicon.

Wafers made from the silicon consistent with embodiments of the invention are suitably thin and can be used in photovoltaic cells. Furthermore, the wafers can be n-type or p-type. For example, wafers can be about 10 microns thick to about 700 microns thick. Further, the wafers used in the photovoltaic cells preferably have a diffusion length ($L_p$) that is greater than the wafer thickness (t). For example, the ratio of $L_p$ to t is suitably at least 0.5. It can, for example, be at least about 1.1, or at least about 2. The diffusion length is the average distance that minority carriers (such as electrons in p-type material) can diffuse before recombining with the majority carriers (holes in p-type material). The $L_p$ is related to the minority carrier lifetime $\tau$ through the relationship $L_p=(D\tau)^{1/2}$, where D is the diffusion constant. The diffusion length can be measured by a number of techniques, such as the Photon-Beam-Induced Current technique or the Surface Photovoltage technique. See for example, "Fundamentals of Solar Cells", by A. Fahrenbruch and R. Bube, Academic Press, 1983, pp. 90-102, for a description of how the diffusion length can be measured.

The wafers can have a width of about 100 millimeters to about 600 millimeters. Preferably, the wafers have at least one dimension being at least about 50 mm. The wafers made from the silicon of the invention, and consequently the photovoltaic cells made by the invention can, for example, have a surface area of about 50 to about 3600 square centimeters. The front surface of the wafer is preferably textured. For example, the wafer can be suitably textured using chemical etching, plasma etching, or laser or mechanical scribing. If a wafer having a (100) pole orientation is used, the wafer can be etched to form an anisotropically textured surface by treating the wafer in an aqueous solution of a base, such as sodium hydroxide, at an elevated temperature, for example about 70° C. to about 90° C., for about 10 to about 120 minutes. The aqueous solution may contain an alcohol, such as isopropanol.

Thus, solar cells can be manufactured using the wafers produced from cast silicon ingots according to the embodiments of the invention, by slicing the solid body of cast silicon to form at least one wafer; optionally performing a cleaning procedure on a surface of the wafer; optionally performing a texturing step on the surface; forming a p-n junction, for example, by doping the surface; optionally depositing an anti-reflective coating on the surface; optionally forming at least one layer selected from a back surface field and a passivating layer by, for example, an aluminum sintering step; and forming electrically conductive contacts on the wafer. A passivating layer is a layer that has an interface with a bare wafer surface that ties up the dangling bonds of the surface atoms. Examples of passivating layers on silicon include silicon nitride, silicon dioxide and amorphous silicon. This layer is generally thinner than one micron, either being transparent to light or acting as an anti-reflective layer.

In a typical and general process for preparing a photovoltaic cell using, for example, a p-type silicon wafer, the wafer is exposed on one side to a suitable n-dopant to form an emitter layer and a p-n junction on the front, or light-receiving side of the wafer. Typically, the n-type layer or emitter layer is formed by first depositing the n-dopant onto the front surface of the p-type wafer using techniques commonly employed in the art such as chemical or physical deposition and, after such deposition, the n-dopant, for example, phosphorus, is driven into the front surface of the silicon wafer to further diffuse the n-dopant into the wafer surface. This "drive-in" step is commonly accomplished by exposing the wafer to high temperatures. A p-n junction is thereby formed at the boundary region between the n-type layer and the p-type silicon wafer substrate. The wafer surface, prior to the phosphorus or other doping to form the emitter layer, can be textured. In order to further improve light absorption, an optional anti-reflective coating, such as silicon nitride, can be typically applied to the front of the wafer, sometimes providing simultaneous surface and or bulk passivation.

In order to utilize the electrical potential generated by exposing the p-n junction to light energy, the photovoltaic cell is typically provided with a conductive front electrical contact on the front face of the wafer and a conductive back electrical contact on the back face of the wafer, although both contacts can be on the back of the wafer. Such contacts are typically made of one or more highly electrically conducting metals and are, therefore, typically opaque.

Thus, solar cells consistent with the embodiments described above may comprise a wafer formed from a body of continuous monocrystalline silicon or near-monocrystalline silicon being free or substantially free of radially-distributed defects, the body can be as described hereinabove, and, for example, having at least two dimensions each being at least about 25 cm and a third dimension being at least about 20 cm, a p-n junction in the wafer, an optional anti-reflective coating on a surface of the wafer; preferably having at least one layer selected from a back surface field and a passivating layer; and electrically conductive contacts on the wafer, wherein the body may be free or substantially free of swirl defects and free or substantially free of OSF defects.

Also, solar cells consistent with the embodiments described above may comprise a wafer formed from a body of continuous geometric multi-crystalline silicon, the body having a predetermined arrangement of grain orientations, preferably with a common pole direction being perpendicular to a surface of the body, the body preferably further having at least two dimensions each preferably being at least about 10 cm, a p-n junction in the wafer; an optional anti-reflective coating on a surface of the wafer, preferably having at least one layer selected from a back surface field and a passivating layer, and electrically conductive contacts on the wafer, wherein the geometric multi-crystalline silicon includes silicon grains having an average crystal grain cross-section size of about 0.5 cm to about 30 cm, and wherein the body may be free or substantially free of swirl defects and free or substantially free of OSF defects.

It will be apparent to those skilled in the art that various modifications and variations can be made in the disclosed structures and methods without departing from the scope or spirit of the invention. For example, the disclosed processes and methods that relate to forming monocrystalline silicon are also applicable to forming near-monocrystalline silicon, or combinations thereof. Moreover, although casting of silicon has been described herein, other semiconductor materials and nonmetallic crystalline materials may be cast without departing from the scope and spirit of the invention. For example, the inventor has contemplated casting of other materials consistent with embodiments of the invention, such as germanium, gallium arsenide, silicon germanium, aluminum oxide (including its single crystal form of sapphire), gallium nitride, zinc oxide, zinc sulfide, gallium indium arsenide, indium antimonide, germanium, yttrium barium oxides, lanthanide oxides, magnesium oxide, calcium oxide, and other semiconductors, oxides, and intermetallics with a liquid phase. In addition, a number of other III-V or II-VI materials, as well as metals and alloys, could be cast according to embodiments of the present invention. Other embodiments of the invention will be apparent to those skilled in the art from consideration of the specification and practice of the invention disclosed herein. It is intended that the specification and examples be considered exemplary only, with a true scope and spirit of the invention being indicated by the following claims.

What is claimed is:

1. A method of casting one or more of a semiconductor, an oxide, and an intermetallic material, comprising:
    placing a molten form of the one or more materials in contact with at least one seed crystal in a vessel having one or more side walls heated to at least the melting temperature of the one or more materials, and at least one wall for cooling; and
    forming a solid body comprising a monocrystalline form of the one or more materials, optionally having at least two dimensions each being at least about 10 cm, by cooling the molten form of the one or more materials to control crystallization, wherein the forming includes forming a solid-liquid interface at an edge of the molten form of the one or more materials that optionally at least initially parallels the at least one wall for cooling, the interface being controlled during the cooling so as to move in a direction that increases a distance between the molten form of the one or more materials and the at least one wall for cooling.

2. The method according to claim 1, wherein the placing further includes placing the at least one seed crystal in a bottom of a crucible, and further wherein the cooling moves the solid-liquid interface in a direction away from the bottom of the crucible while maintaining the edge that parallels the at least one wall for cooling.

3. The method according to claim 2, further comprising arranging the at least one seed crystal so that a specific pole direction of the at least one seed crystal is perpendicular to a bottom of the crucible.

4. The method according to claim 2, wherein the placing the molten form of the one or more materials further includes melting feedstock of the one or more materials in a melt container separate from the crucible, heating the crucible and the one or more materials to the melting temperature of the one or more materials, controlling the heating so that the at least one seed crystal in the crucible does not melt completely, and transferring the molten form of the one or more materials from the melt container into the crucible.

5. The method according to claim 2, further including forming a portion of the body to include the at least one seed crystal.

6. A method of casting one or more of a semiconductor, an oxide, and an intermetallic material, comprising:
    placing a geometric arrangement of a plurality of seed crystals comprising a monocrystalline form of the one or more materials on at least one surface in a crucible having one or more side walls heated to at least the melting temperature of the one or more materials, and at least one wall for cooling, wherein the geometric arrangement includes close-packed polygons or hexagons;

placing a molten form of the one or more materials in contact with the geometric arrangement of the seed crystals; and forming a solid body comprising a monocrystalline form of the one or more materials, optionally having at least two dimensions each being at least about 10 cm, by cooling the molten form of the one or more materials to control crystallization, wherein the forming includes forming a solid-liquid interface at an edge of the molten form of the one or more materials that parallels the at least one wall for cooling, the interface being controlled during the cooling so as to move in a direction that increases a distance between the molten form of the one or more materials and the at least one wall for cooling.

7. A method of casting one or more of a semiconductor, an oxide, and an intermetallic material, comprising:

arranging a plurality of seed crystals comprising a monocrystalline form of the one or more materials in a predetermined pattern on at least two surfaces of a crucible;

placing a molten form of the one or more materials in contact with the monocrystalline seed crystals; and forming a solid body comprising a monocrystalline form of the one or more materials, optionally having at least two dimensions each being at least about 10 cm, by cooling the molten form of the one or more materials from the at least two surfaces of the crucible to control crystallization, wherein the forming includes controlling a solid-liquid interface at an edge of the molten form of the one or more materials during the cooling so as to move in a direction that increases a distance between the molten form of the one or more materials and the at least two surfaces of the crucible.

8. A method of casting one or more of a semiconductor, an oxide, and an intermetallic material, comprising:

placing feedstock of the one or more materials in contact with at least one seed crystal comprising a monocrystalline form of the one or more materials on at least one surface;

heating the feedstock and the at least one seed crystal to the melting temperature of the one or more materials;

controlling the heating so that the at least one seed crystal does not melt completely, the controlling comprising maintaining a .DELTA.T of about 0.1.degree. C./min or less, as measured on an outside surface of the crucible, after reaching the melting temperature of the one or more materials elsewhere in the crucible; and, once the at least one seed crystal is partially melted, forming a solid body comprising a monocrystalline form of the one or more materials by cooling the one or more materials.

9. The method according to claim 8, wherein the placing further includes placing the at least one seed crystal in a bottom of a crucible.

10. The method according to claim 8, further including forming a portion of the body to include the at least one seed crystal.

11. A method of casting one or more of a semiconductor, an oxide, and an intermetallic material, comprising:

placing a geometric arrangement of a plurality of seed crystals comprising a monocrystalline form of the one or more materials on at least one surface in a crucible, wherein the geometric arrangement includes close-packed polygons or hexagons;

placing feedstock of the one or more materials in contact with the plurality of seed crystals on the at least one surface;

heating the feedstock and the plurality of seed crystals to the melting temperature of the one or more materials;

controlling the heating so that the plurality of seed crystals does not melt completely, the controlling comprising maintaining a .DELTA.T of about 0.1.degree. C./min or less, as measured on an outside surface of the crucible, after reaching the melting temperature of the one or more materials elsewhere in the crucible; and, once the at least one seed crystal is partially melted, forming a solid body comprising a monocrystalline form of the one or more materials by cooling the one or more materials.

12. A method of casting one or more of a semiconductor, an oxide, and an intermetallic material, comprising:

arranging a plurality of seed crystals comprising a monocrystalline form of the one or more materials in a predetermined pattern on at least two surfaces of a crucible;

placing feedstock of the one or more materials in contact with the plurality of seed crystals on the at least two surfaces;

heating the feedstock and the plurality of seed crystals to the melting temperature of the one or more materials;

controlling the heating so that the plurality of seed crystals does not melt completely, the controlling comprising maintaining a .DELTA.T of about 0.1.degree. C./min or less, as measured on an outside surface of the crucible, after reaching the melting temperature of the one or more materials elsewhere in the crucible; and, once at least one monocrystalline seed crystal is partially melted, forming a solid body comprising a monocrystalline form of the one or more materials by cooling the one or more materials.

13. A method of casting one or more of a semiconductor, an oxide, and an intermetallic material, comprising:

placing a molten form of the one or more materials in contact with at least one seed crystal in a vessel having one or more side walls heated to at least the melting temperature of the one or more materials, the at least one seed crystal arranged to cover an entire or substantially an entire area of a surface of the vessel; and forming a solid body comprising a monocrystalline form of the one or more materials, optionally having at least two dimensions each being at least about 10 cm, by cooling the molten form of the one or more materials to control crystallization.

14. The method according to claim 1, wherein one or more of a semiconductor, an oxide, and an intermetallic material is selected from the group consisting of germanium, gallium arsenide, silicon germanium, aluminum oxide, sapphire, gallium nitride, zinc oxide, zinc sulfide, gallium indium arsenide, indium antimonide, germanium, yttrium barium oxides, lanthanide oxides, magnesium oxide, and calcium oxide.

15. The method according to claim 6 wherein one or more of a semiconductor, an oxide, and an intermetallic material is selected from the group consisting of germanium, gallium arsenide, silicon germanium, aluminum oxide, sapphire, gallium nitride, zinc oxide, zinc sulfide, gallium indium arsenide, indium antimonide, germanium, yttrium barium oxides, lanthanide oxides, magnesium oxide, and calcium oxide.

16. The method according to claim 7 wherein one or more of a semiconductor, an oxide, and an intermetallic material is selected from the group consisting of germanium, gallium arsenide, silicon germanium, aluminum oxide, sapphire, gallium nitride, zinc oxide, zinc sulfide, gallium indium arsenide, indium antimonide, germanium, yttrium barium oxides, lanthanide oxides, magnesium oxide, and calcium oxide.

17. The method according to claim 8 wherein one or more of a semiconductor, an oxide, and an intermetallic material is selected from the group consisting of germanium, gallium arsenide, silicon germanium, aluminum oxide, sapphire, gallium nitride, zinc oxide, zinc sulfide, gallium indium arsenide, indium antimonide, germanium, yttrium barium oxides, lanthanide oxides, magnesium oxide, and calcium oxide.

18. The method according to claim 11 wherein one or more of a semiconductor, an oxide, and an intermetallic material is selected from the group consisting of germanium, gallium arsenide, silicon germanium, aluminum oxide, sapphire, gallium nitride, zinc oxide, zinc sulfide, gallium indium arsenide, indium antimonide, germanium, yttrium barium oxides, lanthanide oxides, magnesium oxide, and calcium oxide.

19. The method according to claim 12 wherein one or more of a semiconductor, an oxide, and an intermetallic material is selected from the group consisting of germanium, gallium arsenide, silicon germanium, aluminum oxide, sapphire, gallium nitride, zinc oxide, zinc sulfide, gallium indium arsenide, indium antimonide, germanium, yttrium barium oxides, lanthanide oxides, magnesium oxide, and calcium oxide.

20. The method according to claim 13 wherein one or more of a semiconductor, an oxide, and an intermetallic material is selected from the group consisting of germanium, gallium arsenide, silicon germanium, aluminum oxide, sapphire, gallium nitride, zinc oxide, zinc sulfide, gallium indium arsenide, indium antimonide, germanium, yttrium barium oxides, lanthanide oxides, magnesium oxide, and calcium oxide.

21. The method according to any one of claim 12 wherein one or more of a semiconductor, an oxide, and an intermetallic material is selected from the group consisting of germanium, gallium arsenide, silicon germanium, aluminum oxide, sapphire, gallium nitride, zinc oxide, zinc sulfide, gallium indium arsenide, indium antimonide, germanium, yttrium barium oxides, lanthanide oxides, magnesium oxide, and calcium oxide.

22. The method according to any one of claim 13 wherein one or more of a semiconductor, an oxide, and an intermetallic material is selected from the group consisting of germanium, gallium arsenide, silicon germanium, aluminum oxide, sapphire, gallium nitride, zinc oxide, zinc sulfide, gallium indium arsenide, indium antimonide, germanium, yttrium barium oxides, lanthanide oxides, magnesium oxide, and calcium oxide.

\* \* \* \* \*